(12) United States Patent
Lee et al.

(10) Patent No.: US 9,991,007 B2
(45) Date of Patent: Jun. 5, 2018

(54) NONVOLATILE MEMORY DEVICE AND A METHOD OF OPERATING THE SAME

(71) Applicant: SAMSUNG ELECTRONICS CO., LTD., Suwon-Si, Gyeonggi-Do (KR)

(72) Inventors: Ji-Sang Lee, Iksan-Si (KR); Sang-Soo Park, Hwaseong-Si (KR); Dong-Kyo Shim, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 143 days.

(21) Appl. No.: 15/207,774

(22) Filed: Jul. 12, 2016

(65) Prior Publication Data
US 2017/0125128 A1    May 4, 2017

(30) Foreign Application Priority Data
Nov. 3, 2015    (KR) ........................ 10-2015-0153893

(51) Int. Cl.
| | |
|---|---|
| *G11C 29/12* | (2006.01) |
| *G11C 7/10* | (2006.01) |
| *G11C 7/12* | (2006.01) |
| *G11C 7/14* | (2006.01) |
| *G11C 7/22* | (2006.01) |
| *G11C 8/10* | (2006.01) |
| *G11C 29/56* | (2006.01) |

(Continued)

(52) U.S. Cl.
CPC .......... *G11C 29/1201* (2013.01); *G11C 7/106* (2013.01); *G11C 7/1006* (2013.01); *G11C 7/1039* (2013.01); *G11C 7/1057* (2013.01); *G11C 7/12* (2013.01); *G11C 7/14* (2013.01); *G11C 7/222* (2013.01); *G11C 8/10* (2013.01); *G11C 11/5642* (2013.01); *G11C 16/0483* (2013.01); *G11C 16/26* (2013.01); *G11C 29/42* (2013.01); *G11C 29/50012* (2013.01); *G11C 29/52* (2013.01); *G11C 29/56008* (2013.01); *G11C 27/02* (2013.01); *G11C 2029/0411* (2013.01); *G11C 2029/5004* (2013.01); *G11C 2211/5642* (2013.01)

(58) Field of Classification Search
None
See application file for complete search history.

(56) References Cited

U.S. PATENT DOCUMENTS 5,969,986 A * 10/1999 Wong .................. G11C 7/1039
                                                           365/185.03
7,903,468 B2    3/2011 Litsyn et al.

(Continued)

*Primary Examiner* — Steve Nguyen
(74) *Attorney, Agent, or Firm* — F. Chau & Associates, LLC

(57) ABSTRACT

A nonvolatile memory device with a memory cell array including a plurality of memory cells coupled to first through M-th wordlines and first through N-th bitlines (M>2, N>2), and a page buffer circuit including first through N-th page buffers that are coupled to the first through N-th bitlines, respectively, and generate first through N-th output data, respectively. A K-th page buffer includes first through L-th latches which generate read data by sampling a voltage of a K-th output line, which is discharged through a K-th bitline, at different sampling timings after a read voltage is applied to a P-th wordline (K≤N, L>1, P≤M). The K-th page buffer outputs the first output data if an error in the read data of the first latch is correctable.

20 Claims, 24 Drawing Sheets

(51) Int. Cl.

| | |
|---|---|
| *G11C 11/56* | (2006.01) |
| *G11C 29/42* | (2006.01) |
| *G11C 29/52* | (2006.01) |
| *G11C 16/04* | (2006.01) |
| *G11C 16/26* | (2006.01) |
| *G11C 29/50* | (2006.01) |
| G11C 29/04 | (2006.01) |
| G11C 27/02 | (2006.01) |

(56) References Cited

U.S. PATENT DOCUMENTS

| | | | |
|---|---|---|---|
| 7,957,187 B2 | 6/2011 | Mokhlesi et al. | |
| 8,164,961 B2 | 4/2012 | Honma | |
| 8,248,851 B1* | 8/2012 | Pio | G11C 11/5642 |
| | | | 365/185.11 |
| 8,406,053 B1 | 3/2013 | Dutta et al. | |
| 8,850,292 B2 | 9/2014 | Lee | |
| 8,885,409 B2 | 11/2014 | Lee et al. | |
| 9,293,211 B2* | 3/2016 | Park | G11C 16/26 |
| 9,430,735 B1* | 8/2016 | Vali | G06N 3/04 |
| 2008/0037345 A1* | 2/2008 | Fort | G11C 7/067 |
| | | | 365/205 |
| 2012/0269007 A1* | 10/2012 | Yang | G11C 7/00 |
| | | | 365/189.05 |
| 2013/0155770 A1* | 6/2013 | Hirano | G11C 16/24 |
| | | | 365/185.03 |
| 2013/0343124 A1 | 12/2013 | Ma et al. | |
| 2014/0036597 A1 | 2/2014 | Nakayama | |
| 2014/0153331 A1 | 6/2014 | Jang et al. | |
| 2015/0113322 A1 | 4/2015 | Lee | |
| 2017/0125128 A1* | 5/2017 | Lee | G11C 7/1057 |

\* cited by examiner

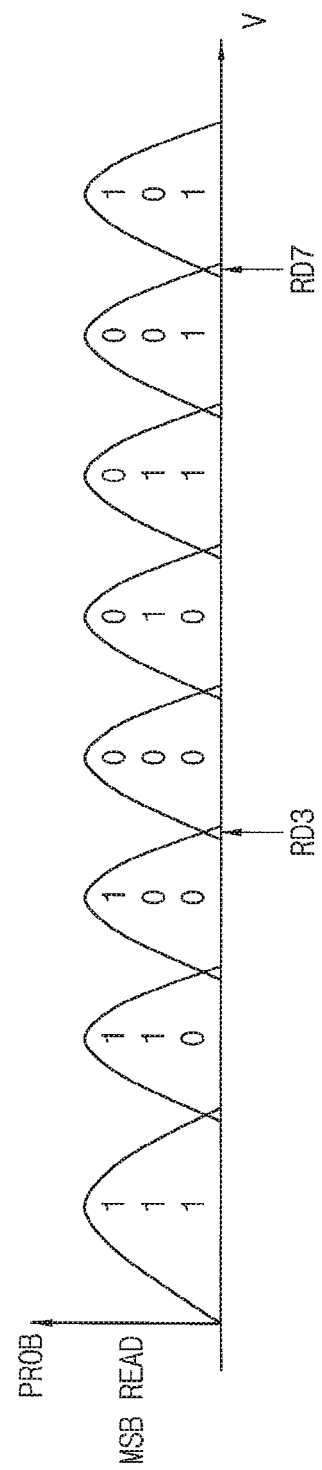

130B

NONVOLATILE MEMORY DEVICE AND A METHOD OF OPERATING THE SAME

CROSS-REFERENCE TO RELATED APPLICATION

This U.S. application claims priority under 35 U.S.C. § 119 to Korean Patent Application No. 10-2015-0153893, filed on Nov. 3, 2015, in the Korean Intellectual Property Office (KIPO), the disclosure of which is incorporated by reference herein in its entirety.

TECHNICAL FIELD

Exemplary embodiments of the inventive concept relate generally to memory devices, and more particularly to nonvolatile memory devices and methods of operating nonvolatile memory devices.

DISCUSSION OF RELATED ART

Memory cells of a nonvolatile memory device, such as a flash memory device, may store data by using multiple threshold voltage distributions to represent different logic states of the data. For example, a multi-level cell may have four states per cell, so it can store two bits of information per cell. The data stored in the memory cells may be read by checking whether each memory cell is turned on or off when a predetermined read voltage is applied to the memory cell.

While or after the memory cells are programmed to have the threshold voltage distributions, each threshold voltage distribution may widen due to a charge leakage, a program disturb, an electrical coupling, a change in temperature, a change in voltage, etc. If the threshold voltage distributions are widened, the data may be inaccurately read. In other words, a read failure may occur. In the event of a read failure, a nonvolatile memory device may perform a read retry. However, this may lead to an increase in read time.

SUMMARY

According to an exemplary embodiment of the inventive concept, a nonvolatile memory device includes a memory cell array and a page buffer circuit. The memory cell array includes a plurality of memory cells coupled to first through M-th wordlines and first through N-th bitlines, and M and N are integers greater than two. The page buffer circuit includes first through N-th page buffers coupled to the first through N-th bitlines, respectively, and the first through N-th page buffers generates first through N-th output data, respectively. A K-th page buffer of the first through N-th page buffers includes first through L-th latches which generate read data by sampling a voltage of K-th output line, which is discharged through the K-th bitline, at different sampling timings after a read voltage is applied to a P-th wordline of the first through M-th wordlines. K is a natural number less than or equal to N, L is a natural number greater than one, and P is a natural number less than or equal to M. The K-th page buffer outputs the first output data based on whether an error in the read data of the first latch is correctable.

In an exemplary embodiment of the inventive concept, wherein the K-th page buffer may output one of the read data of the second through L-th latches as the first output data when the error in the read data of the first latch is uncorrectable.

In an exemplary embodiment of the inventive concept, the K-th page buffer may output error-corrected read data of the first latch as the first output data when the error in the read data of the first latch is correctable.

In an exemplary embodiment of the inventive concept, the K-th page buffer may charge the K-th bitline with a precharge voltage and may charge the K-th output line with a power supply voltage, and then, may discharge the K-th output line through the K-th bitline in a discharge interval. The sampling timings may be located within the discharge interval.

When the voltage of the K-th output line is greater than or equal to a reference voltage at one of the sampling timings, the K-th page buffer may determine that a first memory cell connected to the P-th wordline and the K-th bitline is an off-cell whose threshold voltage is greater than or equal to the read voltage; otherwise, the K-th page buffer may determine that the memory cell is an on-cell whose threshold voltage is less than the read voltage.

The K-th page buffer determines, at one of the sampling timings, whether a first memory cell is either an off-cell whose threshold voltage is greater than or equal to the read voltage or an on-cell whose threshold voltage is less than the read voltage. The earlier the sampling timing occurs during the discharge interval, the higher a probability that the K-th page buffer determines that the first memory cell is the off-cell. The later the sampling timing occurs during the discharge interval, the higher a probability that the K-th page buffer determines that the first memory cell is the on-cell.

The nonvolatile memory device may further include a control circuit and an address decoder. The control circuit may generate a row address signal and a column address signal in response to a command signal and an address signal. The address decoder may apply at least one read voltage to one of the first through M-th wordlines. The page buffer circuit may operate in response to the column address signal.

When each of the memory cells is a single-level cell, the address decoder may apply a read voltage to one of the first through M-th wordlines and the page buffer circuit may sample the voltages of the first through N-th output lines.

When each of the memory cells is a multi-level cell or a triple-level cell, the address decoder may sequentially apply a plurality of read voltages to one of the first through M-th wordlines and the page buffer circuit may sequentially sample the voltages of the first through N-th output lines multiple times.

According to an exemplary embodiment of the inventive concept, in a method of operating a nonvolatile memory device including a memory cell array which has a plurality of memory cells coupled to first through M-th wordlines and first through N-th bitlines, wherein M and N are integers greater than two, a first read voltage is applied to a P-th wordline of the first through M-th wordlines, wherein P is a natural number less than or equal to M. The first through N-th bitlines are charged with a precharge voltage. A plurality of output lines in a page buffer circuit coupled to the first through N-th bitlines are charged with a power supply voltage. The plurality of output lines are discharged through the first through N-th bitlines at a first discharging timing. A first read data is generated by sampling voltages of the output lines in first latches of the page buffer circuit at a first sampling timing. A second read data is generated by sampling voltages of the output lines in second latches of the page buffer circuit at a second sampling timing. It is determined whether errors in the first read data are correctable. An output data is output from the page buffer circuit based on whether the errors in the first read data are correctable.

In an exemplary embodiment of the inventive concept, the second read data may be output, from the page buffer circuit, as the output data when the first read data includes uncorrectable errors.

In an exemplary embodiment of the inventive concept, error-corrected first read data may be output, from the page buffer circuit, as the output data when the first read data includes correctable errors.

In an exemplary embodiment of the inventive concept, in a method of operating the nonvolatile memory device, a second read voltage may be applied to the P-th wordline. The first through N-th bitlines may be charged with the precharge voltage after applying the second read voltage. The plurality of output lines in the page buffer circuit may be charged with the power supply voltage after applying the second read voltage. The plurality of output lines may be discharged through the first through N-th bitlines at a second discharging timing after applying the second read voltage. The first read data may be updated by sampling voltages of the output lines in the first latches of the page buffer circuit at a third sampling timing. The second read data may be updated by sampling voltages of the output lines in the second latches of the page buffer circuit at a fourth sampling timing.

An interval from the first discharging timing to the first sampling timing may be substantially the same as an interval from the second discharging timing to the third sampling timing. An interval from the first discharging timing to the second sampling timing may be substantially the same as an interval from the second discharging timing to the fourth sampling timing.

In an exemplary embodiment of the inventive concept, determining whether the errors in the first read data are correctable may include determining whether the errors in the first read data are correctable using an error correction code (ECC).

In an exemplary embodiment of the inventive concept, for a method of operating a nonvolatile memory device including a page buffer circuit with first through N-th page buffers, wherein a K-th page buffer includes first through L-th latches, N and L are integers greater than two, and K is a natural number less than or equal to N, the method may include: generating read data by sampling voltages of output lines in the first through L-th latches; determining whether errors in a first read data from the first latch are correctable; outputting, from the page buffer circuit, the first read data as an output data if the errors in the first read data are all correctable, after the errors in the first read data have been corrected; and outputting, from the page buffer circuit, read data from one of the second through L-th latch as the output data if there is at least one error in the first read data that is uncorrectable.

In an exemplary embodiment of the inventive concept, the output data may be output through a cache latch.

The first read data with correctable errors may be read by changing a read voltage.

In an exemplary embodiment of the inventive concept, the method of operating a nonvolatile memory device may further include: determining threshold voltage distributions of a memory cell by applying read voltages to the memory cell; and reading at least one bit from the memory cell through application of the read voltages.

In an exemplary embodiment of the inventive concept, the at least one bit may include a least significant bit, a central significant bit, and a most significant bit.

In an exemplary embodiment of the inventive concept, read data may be generated at a plurality of sampling timings. The sampling timings correspond to first through L-th set signals and reset signals that are applied to the first through L-th latches, respectively.

In an exemplary embodiment of the inventive concept, the method of operating a nonvolatile memory device may further include discharging an output line of the K-th page buffer during a developing interval, wherein generating the read data occurs during the developing interval.

In an exemplary embodiment of the inventive concept, the method of operating a nonvolatile memory device may further include: generating read data of the first latch at a first sampling timing; and generating read data of the second latch at a second sampling timing, wherein the first sampling timing and the second sampling timing are within the developing interval, and the first sampling timing and the second sampling timing are different.

In an exemplary embodiment of the inventive concept, determining whether errors in a first read data are correctable may further include: moving the first read data to the cache latch for outputting; correcting errors in the first read data using an error correction code (ECC); and moving read data from the second latch to the cache latch for outputting if error correction fails.

BRIEF DESCRIPTION OF THE DRAWINGS

The above and other features of the inventive concept will be more clearly understood by describing in detail exemplary embodiments thereof with reference to the accompanying drawings.

FIGS. 4A through 4C are graphs illustrating initial threshold voltage distributions of memory cells in FIG. 1 according to an exemplary embodiment of the inventive concept.

DETAILED DESCRIPTION OF THE EMBODIMENTS

Figure 1:
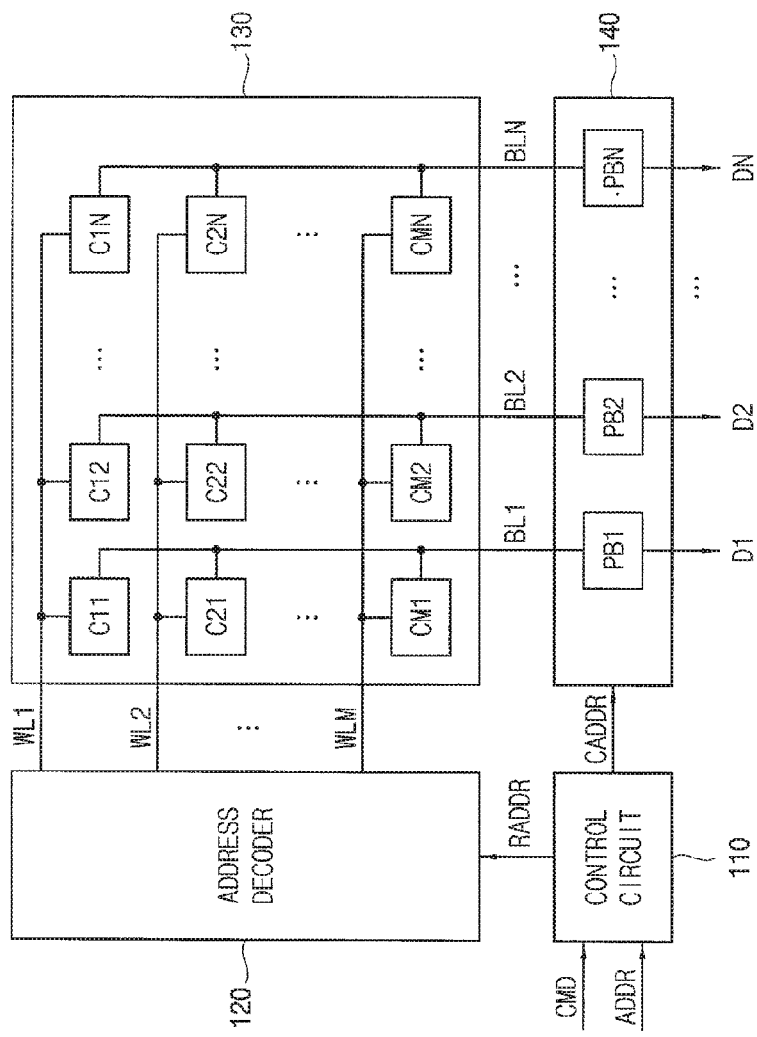
FIG. 1 is a block diagram illustrating a nonvolatile memory device according to an exemplary embodiment of the inventive concept.

Exemplary embodiments of the inventive concept will be described more fully hereinafter with reference to the accompanying drawings. The present inventive concept may, however, be embodied in many different forms and should not be construed as limited to the exemplary embodiments set forth herein. In the drawings, the sizes and relative sizes of layers and regions may be exaggerated for clarity. Like numerals may refer to like elements throughout this application. All elements shown in the drawings or hereinafter described may be composed of circuits.

It will be understood that when an element is referred to as being "connected" or "coupled" to another element, it can be directly connected or coupled to the other element or intervening elements may be present.

As used herein, the singular forms "a," "an" and "the" are intended to include the plural forms as well, unless the context clearly indicates otherwise.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

FIG. 1 is a block diagram illustrating a nonvolatile memory device according to exemplary embodiment of the inventive concept.

Referring to FIG. 1, a nonvolatile memory device 100 includes a control circuit 110, an address decoder 120, a memory cell array 130, and a page buffer circuit 140.

The memory cell array 130 includes a plurality of memory cells C11, C12~C1N, C21, C22~C2N, . . . CM1, CM2~CMN. The page buffer circuit 140 may include first through N-th page buffers PB1~PBN which are coupled to the first through N-th bitlines BL1~BLN respectively. N is a natural number greater than two.

The control circuit 110 may generate a row address signal RADDR and a column address signal CADDR based on a command signal CMD and an address signal ADDR. The address decoder 120 may apply a read voltage to one of first through M-th wordlines WL1~WLM based on the row address signal RADDR. M is a natural number greater than two. The memory cells C11~CMN are coupled to a plurality of the wordlines WL1~WLM and a plurality of the bitlines BL1~BLN respectively in a matrix configuration.

The first through N-th page buffers PB1~PBN are coupled to the first through N-th bitlines BL1~BLN respectively and generate first through N-th output data D1~DN respectively. The first through N-th page buffers PB1~PBN may include first through N-th output lines.

A K-th page buffer (K is a natural number equal to or smaller than N) of the first through N-th page buffers PB1~PBN may include first through L-th latches. L is a natural number equal to or greater than two. After a read voltage is applied to a P-th wordline (P is a natural number equal to or smaller than M) of the first through M-th wordlines WL1~WLM, the first through L-th latches generate read data, respectively, by sampling a voltage of a K-th output line which is discharged through a K-th bitline BLK, at different sampling timings. The K-th buffer outputs a K-th output data based on whether errors in a read data of the first latch are correctable. When the errors in the read data of the first latch are uncorrectable, the K-th buffer outputs one of the read data of the second through L-th latches as the K-th output data DK. When the errors in the read data of the first latch are correctable, the K-th buffer outputs error-corrected read data of the first latch as the K-th output data DK.

When each of the memory cells C11~CMN is a single-level cell, the address decoder 120 applies a read voltage to one of the first through M-th wordlines WL1~WLM and the page buffer circuit 140 samples the voltages of the first through N-th output lines once.

When each of the memory cells C11~CMN is a multi-level cell or a triple-level cell, the address decoder 120 sequentially applies a plurality of read voltages to one of the first through M-th wordlines WL1~WLM and the page buffer circuit 140 sequentially samples the voltages of the first through N-th output lines multiple times.

Figure 2:
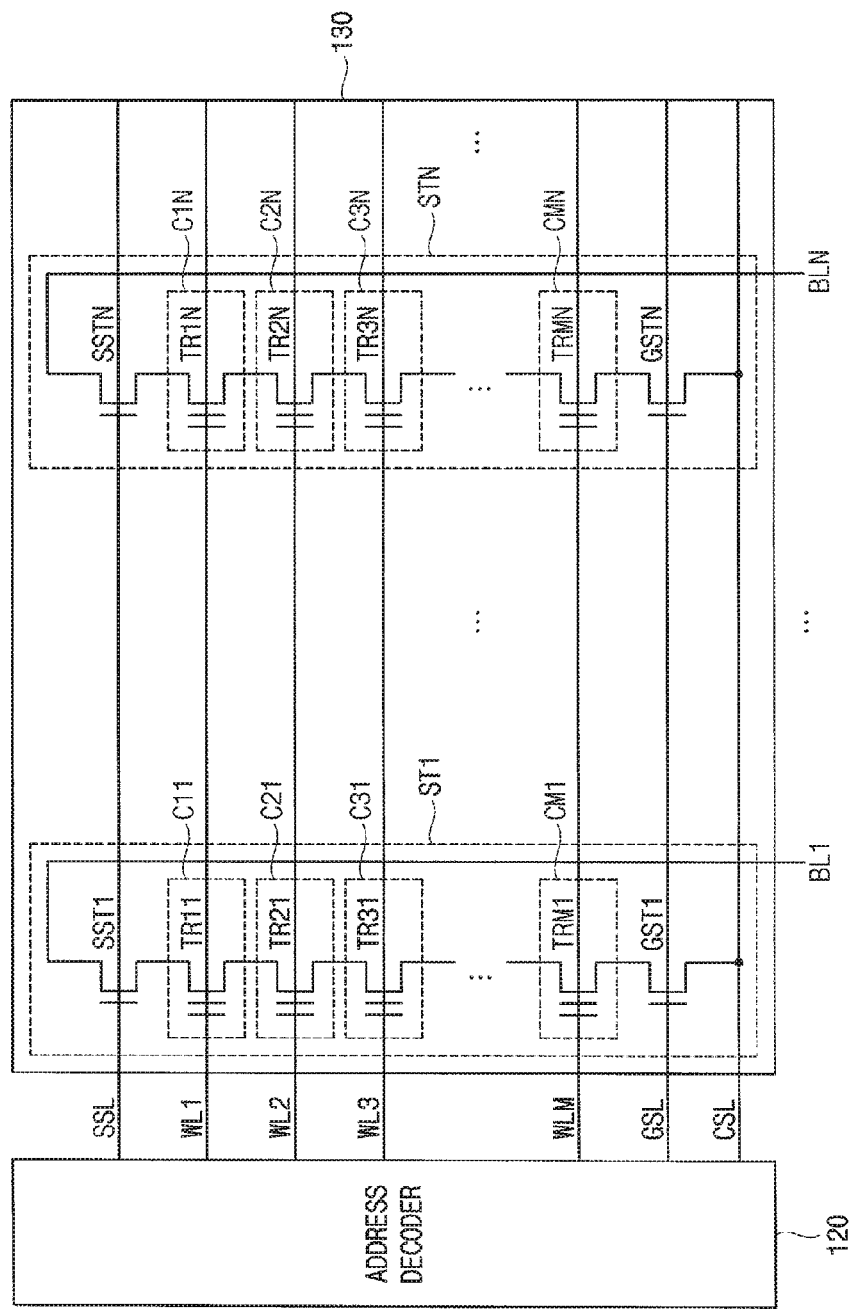
FIG. 2 is a block diagram illustrating an example of the memory cell array in the nonvolatile memory device of FIG. 1, which is implemented with a planar or two-dimensional (2-D) structure according to an exemplary embodiment of the inventive concept.

FIG. 2 is a block diagram illustrating an example of the memory cell array in the nonvolatile memory device of FIG. 1, which is implemented with a planar or two-dimensional (2-D) structure according to an exemplary embodiment of the inventive concept.

Referring to FIG. 2, the address decoder 120 may be coupled to the memory cell array 130 through a string selection line SSL, the first through M-th wordlines WL1~WLM, a ground selection line GSL and a common source line CSL.

The memory cell array 130 may include first through N-th cell strings ST1~STN. The first cell string ST1 may be coupled between the first bitline BL1 and the common source line CSL. The N-th cell string STN may be coupled between the N-th bitline BLN and the common source line CSL.

The first cell string ST1 includes a first string selection transistor SST1, first through M-th memory cells C11~CM1 which are implemented with first through M-th floating gate transistors TR11~TRM1 and a first ground selection transistor GST1. A gate of the first string selection transistor SST1 is coupled to the string selection line SSL. A gate of the first ground selection transistor GST1 is coupled to the ground selection line GSL. Gates of the first through M-th floating gate transistors TR11~TRM1 are coupled to the first through M-th wordlines WL1~WLM respectively.

The N-th cell string STN includes a N-th string selection transistor SSTN, first through M-th memory cells C1N~CMN which are implemented with first through M-th floating gate transistors TR1N~TRMN and a N-th ground selection transistor GST1. A gate of the N-th string selection transistor SSTN is coupled to the string selection line SSL. A gate of the N-th ground selection transistor GSTN is coupled to the ground selection line GSL. Gates of the first through M-th floating gate transistors TR1N~TRMN are coupled to the first through M-th wordlines WL1~WLM respectively.

In an exemplary embodiment of the inventive concept, each of the memory cells C11~CMN in the memory cell array 130 may be a single-level cell (SLC) for storing a data bit. In an exemplary embodiment of the inventive concept, each of the memory cells C11~CMN in the memory cell array 130 may be a multi-level cell (MLC) for storing two data bits. In an exemplary embodiment of the inventive concept, each of the memory cells C11~CMN in the memory cell array 130 may be a triple-level cell (TLC) for storing three data bits.

When the second wordline WL2 is selected in a read operation, a read voltage is applied to the second wordline WL2, and a read pass voltage is applied to unselected wordlines WL1 and WL3~WLN.

The read voltage may be a voltage for detecting threshold voltages of the memory cells C21~C2N coupled to the selected second wordline WL2. The read pass voltage may be a voltage for turning on the memory cells C11~C1N, C31~C3N . . . CM1~CMN coupled to the unselected wordlines WL1 and WL3~WLN. The read pass voltage may be greater than threshold voltages of the memory cells C11~C1N, C31~C3N . . . CM1~CMN. The read pass voltage may be greater than the read voltage.

Figure 3:
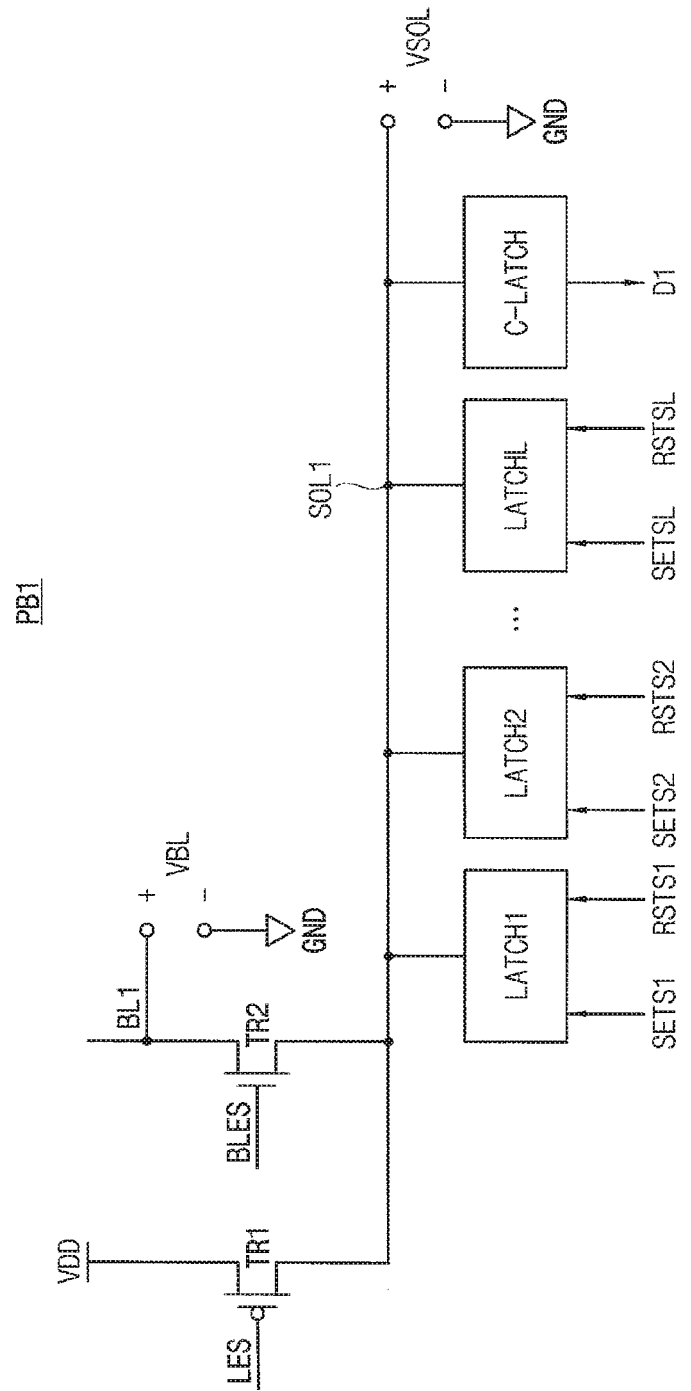
FIG. 3 is a circuit diagram illustrating the first page buffer in FIG. 1 according to an exemplary embodiment of the inventive concept.

FIG. 3 is a circuit diagram illustrating the first page buffer PB1 in FIG. 1 according to exemplary embodiment of the inventive concept.

Each configuration of the second through N-th page buffers PB2~PBN is substantially the same as a configuration of the first page buffer PB1, and thus a detailed description of the second through N-th page buffers PB2~PBN will be omitted herein. The configuration of the first page buffer PB1 is not limited to FIG. 3.

Referring to FIG. 3, the first page buffer PB1 include a PMOS transistor TR1, an NMOS transistor TR2, first through L-th latches LATCH1~LATCHL (L is a natural number equal to or greater than two) and a cache latch C_LATCH.

The PMOS transistor TR1 has a source for receiving a power supply voltage VDD, a gate for receiving a load enable signal LES and a drain coupled to a first output line SOL1. The NMOS transistor TR2 has a drain coupled to the first bitline BL1, a gate for receiving a bitline enable signal BLES and a source coupled to the first output line SOL1.

After the read voltage is applied to the P-th wordline WLP, the first latch LATCH1 generates read data by sampling the voltage of the first output line SOL1, which is discharged through the NMOS transistor TR2 and the first bitline BL1, at a first sampling timing corresponding to a rising edge of a first set signal SETS1 and a first reset signal RSTS1. The second latch LATCH2 generates read data by sampling the voltage of the first output line SOL1, which is discharged through the NMOS transistor TR2 and the first bitline BL1, at a second sampling timing corresponding to a rising edge of a second set signal SETS2 and a second reset signal RSTS2. The remaining latches generate read data in a similar manner. For instance, the L-th latch LATCHL generates read data by sampling the voltage of the first output line SOL1, which is discharged through the NMOS transistor TR2 and the first bitline BL1, at an L-th sampling timing corresponding to a rising edge of an L-th set signal SETSL and an L-th reset signal RSTSL.

The read data generated by the first latch LATCH1 will be described later with reference to FIGS. 7 and 8.

When errors of the read data of the first latch LATCH1 are correctable, the first page buffer PB1 may output the error-corrected read data of the first latch LATCH1 through the cache latch C-LATCH as the first output data D1. When the errors of the read data of the first latch LATCH1 are uncorrectable, the first page buffer PB1 may output one of the read data of the second through L-th latches LATCH2~LATCHL through the cache latch C-LATCH as the first output data D1.

Figure 4A:
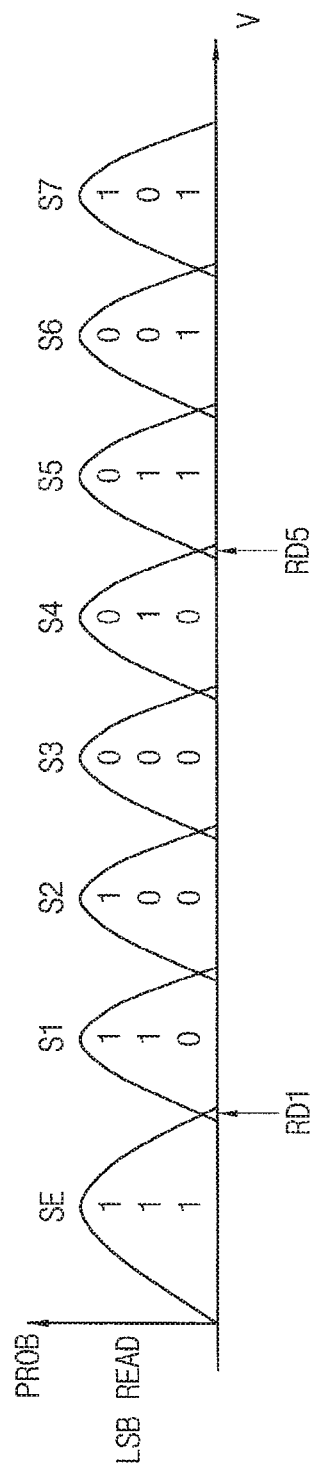
Figure 4B:
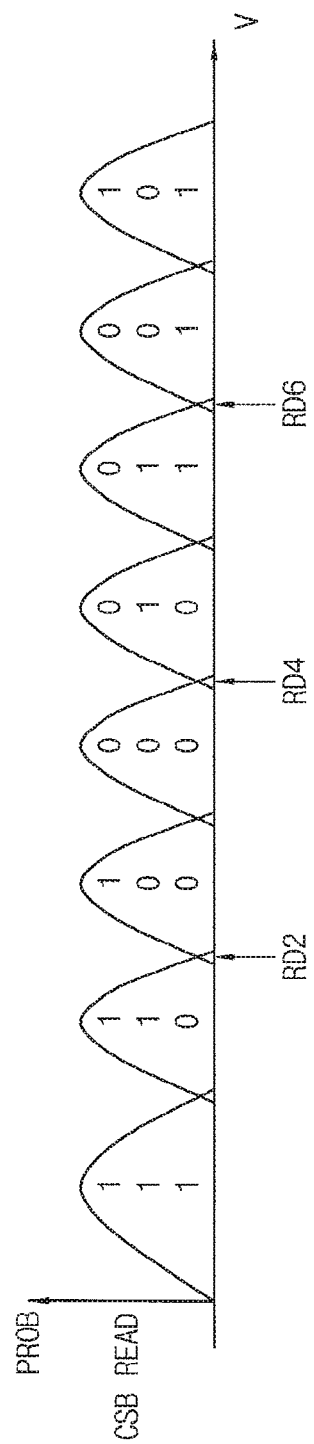

FIGS. 4A through 4C are graphs illustrating initial threshold voltage distributions of memory cells in FIG. 1 according to an exemplary embodiment of the inventive concept.

According to an exemplary embodiment of the inventive concept, each of the memory cells, described with reference to FIGS. 4A to 4C, has a triple-level cell. Initial threshold voltage distributions of memory cells having single level cells or multi-level cells may be understood with reference to FIG. 4.

When the first memory cell C11 has an erased state, the first memory cell has a threshold voltage distribution SE corresponding to the erased state and stores data of '111'. When the first memory cell C11 has a first programmed state, the first memory cell has a threshold voltage distribution S1 corresponding to the first programmed state and stores data of '110'. When the first memory cell C11 has a second programmed state, the first memory cell has a threshold voltage distribution S2 corresponding to the second programmed state and stores data of '100'. When the first memory cell C11 has a third programmed state, the first memory cell has a threshold voltage distribution S3 corresponding to the third programmed state and stores data of '000'. When the first memory cell C11 has a fourth programmed state, the first memory cell has a threshold voltage distribution S4 corresponding to the fourth programmed state and stores data of '010'. When the first memory cell C11 has a fifth programmed state, the first memory cell has a threshold voltage distribution S5 corresponding to the fifth programmed state and stores data of '011'. When the first memory cell C11 has a sixth programmed state, the first memory cell has a threshold voltage distribution S6 corresponding to the sixth programmed state and stores data of '001'. When the first memory cell C11 has a seventh programmed state, the first memory cell has a threshold voltage distribution S7 corresponding to the seventh programmed state and stores data of '101'.

For determining the threshold voltage distribution of the first memory cell C11, read voltages are sequentially applied to the gate of the first memory cell C11 multiple times. A least significant bit (LSB) of the first memory cell C11 may be read by applying a first read voltage RD1 and a fifth read voltage RD5 to the gate of the first memory cell C11, which will be described later with reference to FIGS. 7 and 8. A central significant bit (CSB) of the first memory cell C11 may be read by applying a second read voltage RD2, a fourth read voltage RD4 and a sixth read voltage RD6 to the gate of the first memory cell C11. A most significant bit (MSB) of the first memory cell C11 may be read by applying a third read voltage RD3 and a seventh read voltage RD7 to the gate of the first memory cell C11.

The first memory cell C11 may have different logic states and threshold voltage distributions than what is shown in FIG. 4.

Figure 5:
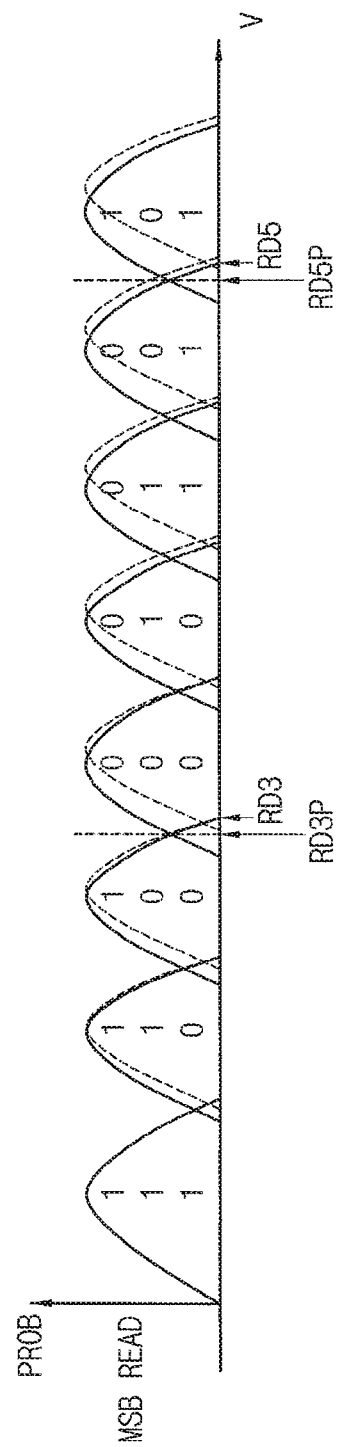
FIG. 5 is a graph illustrating threshold voltage distributions of the memory cells in FIG. 1 when the memory cells are degraded according to an exemplary embodiment of the inventive concept.

FIG. 5 is a graph illustrating threshold voltage distributions of the memory cells in FIG. 1 when the memory cells are degraded according to an exemplary embodiment of the inventive concept.

While or after the first memory cell is programmed to have one of the threshold voltage distributions corresponding to the erased state and the first through seventh programmed states, each threshold voltage distribution may be widened or shifted due to a charge leakage, a program disturb, an electrical coupling, a change in temperature, a change in voltage, etc. For example, when the MSB of the first memory cell C11 is read by applying the third read voltage RD3 and the seventh read voltage RD7, the data may include errors that are uncorrectable by an error correction code (ECC). In the case illustrated in FIG. 5, data may be read with errors that are correctable by an ECC by changing the third read voltage RD3 to a third changed read voltage RD3P and changing the fifth read voltage RD5 to a fifth changed read voltage RD5P, thereby allowing the MSB of the first memory cell C11 to be read.

Figure 6:
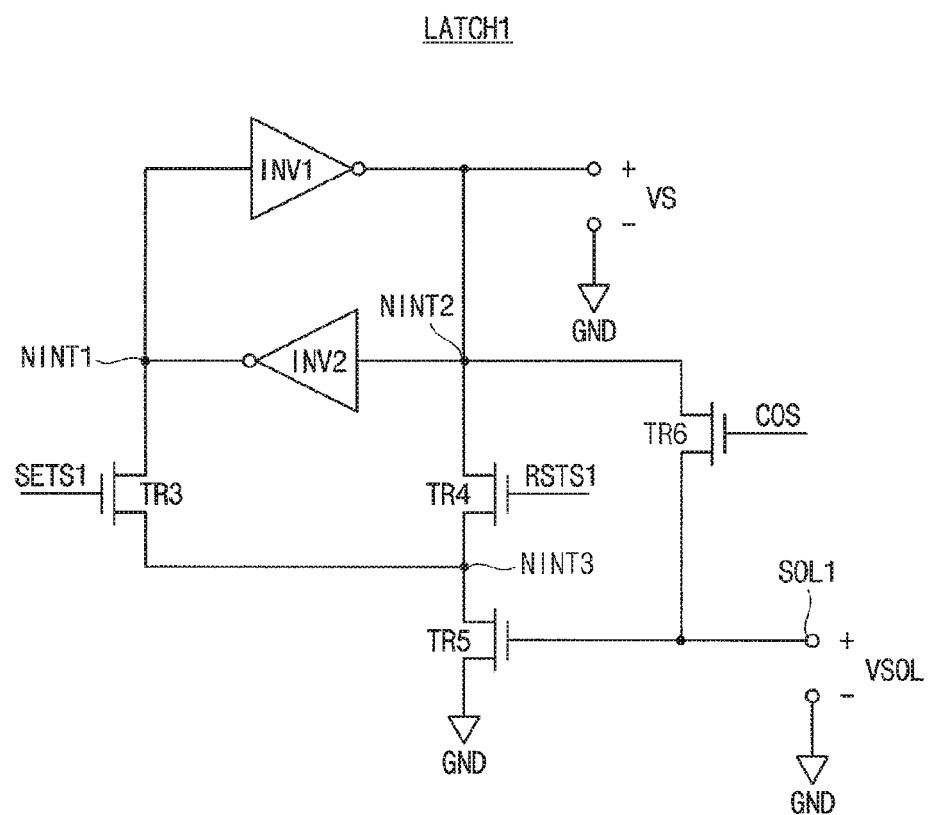
FIG. 6 is a circuit diagram illustrating the first latch in the first page buffer of FIG. 3 according to an exemplary embodiment of the inventive concept.

FIG. 6 is a circuit diagram illustrating the first latch in the first page buffer of FIG. 3 according to an exemplary embodiment of the inventive concept.

Each configuration of the second through L-th latches LATCH2~LATCHL is substantially the same as a configuration of the first latch LATCH1, and thus a detailed description of the second through L-th latches LATCH2~LATCHL will be omitted herein.

Referring to FIG. 6, the first latch LATCH1 includes first and second inverters INV1 and INV2 and first through fourth NMOS transistors TR3~TR6.

The first inverter INV1 has an input terminal coupled to a first internal node NINT1 and an output terminal coupled to a second internal node NINT2. The second inverter INV2 has an input terminal coupled to the second internal node NINT2 and an output terminal coupled to the first internal node NINT1.

The first NMOS transistor TR3 has a drain coupled to the first internal node NINT1, a gate for receiving the first set signal SETS1 and a source coupled to a third internal node NINT3. The second NMOS transistor has a drain coupled to the second internal node NINT2, a gate for receiving the first reset signal RSTS1 and a source coupled to the third internal node NINT3. The third NMOS transistor TR5 has a drain coupled to the third internal node NINT3, a gate coupled to the first output line SOL1 and a source coupled to a ground voltage GND. The fourth NMOS transistor TR6 has a drain coupled to the second internal node NINT2, a gate for receiving a cache output signal COS and a source coupled to the first output line SOL1.

When a voltage VSOL of the first output line SOL1 is equal to or greater than a reference voltage, a voltage VS of the second internal node NINT2 corresponds to the ground voltage GND and the first latch LATCH1 stores a logic low level. When the voltage VSOL of the first output line SOL1 is equal to or greater than the reference voltage and the first set signal SETS1 is enabled, the voltage VS of the second internal node NINT2 corresponds to the power supply voltage VDD and the first latch LATCH1 stores a logic high level. When the voltage VSOL of the first output line SOL1 is smaller than the reference voltage, the first latch LATCH1 maintains read data.

When the cache output signal COS is enabled, the voltage VSOL of the first output line SOL1 is transferred to the voltage VS of the second internal node NINT2, and the read data of the first latch LATCH1 is output as the first output data D1 through the cache latch C-LATCH.

Figure 7:
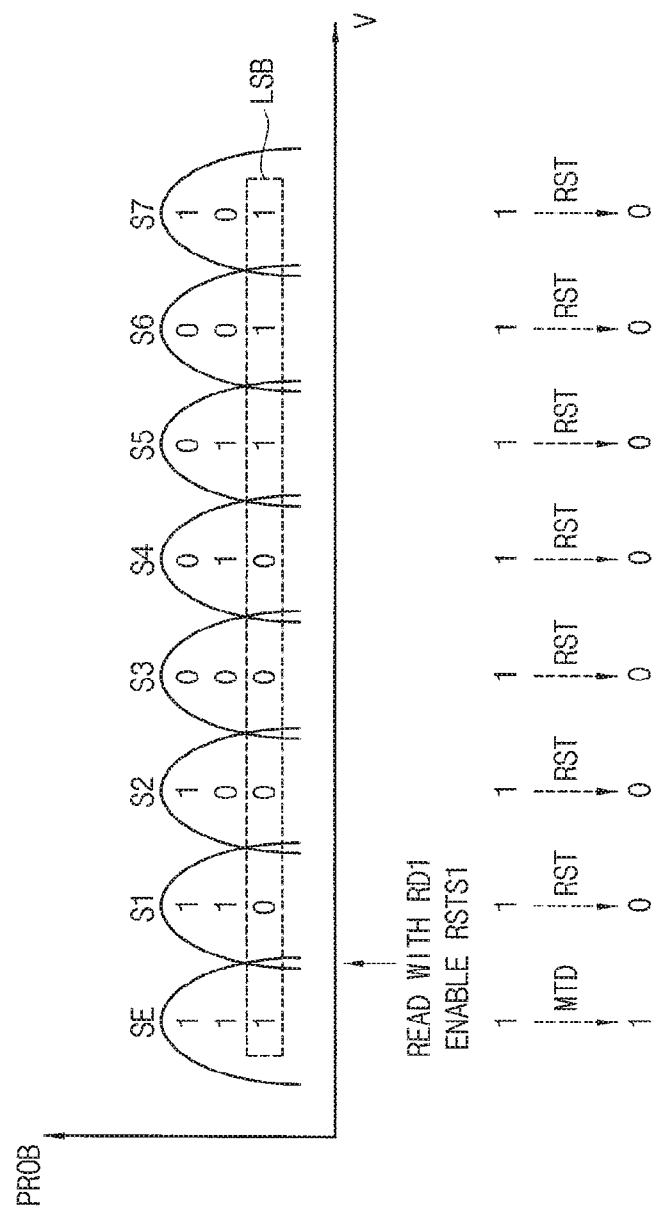
FIGS. 7 and 8 are graphs illustrating that the first latch of FIG. 6 generates the read data according to an exemplary embodiment of the inventive concept.
Figure 8:
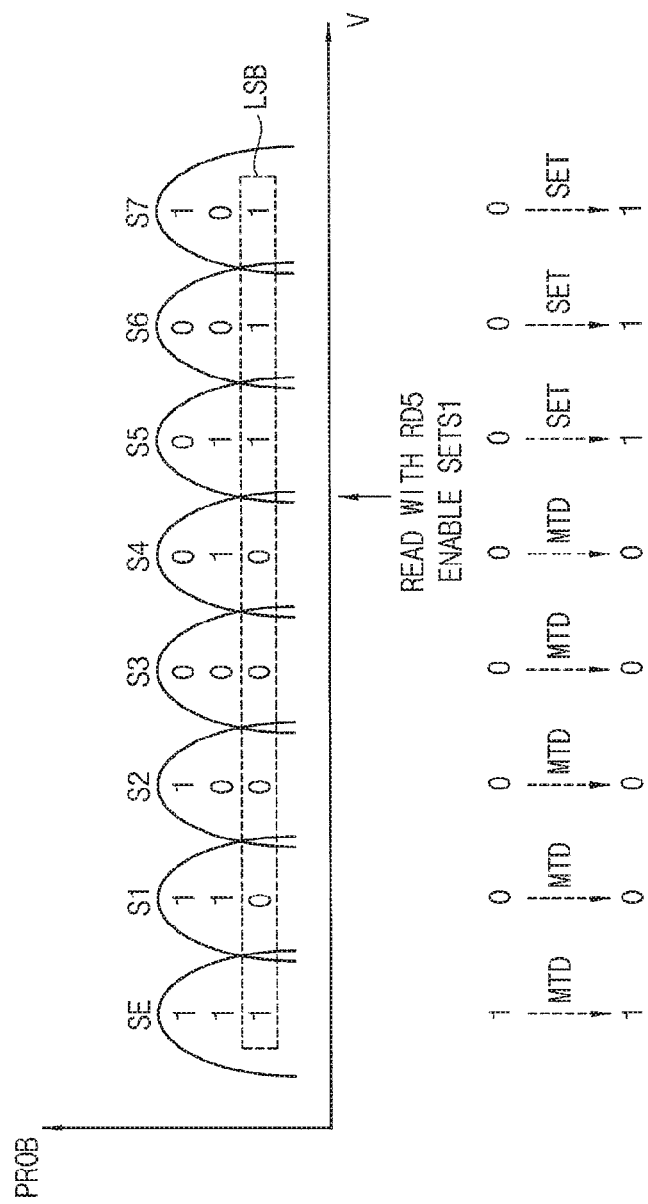

FIGS. 7 and 8 are graphs illustrating that the first latch of FIG. 6 generates the read data according to an exemplary embodiment of the inventive concept.

FIG. 7 illustrates that the first latch LATCH1 generates the read data by reading the LSB of first memory cell C11 using the first read voltage RD1.

The voltage VS of the second internal node NINT2 is precharged to the power supply voltage VDD. In other words, the read data of the first latch LATCH1 is set to '1'. When the first memory cell C11 has the erased state SE and the first read voltage RD1 is applied to the first memory cell C11, the first memory cell C11 is an on-cell whose threshold voltage distribution is smaller than the first read voltage RD1, the voltage VSOL of the first output line SOL1 drops below the reference voltage, and the first latch LATCH1 maintains the read data as '1' (MTD). When the first memory cell C11 has one of the first through seventh programmed states S1~S7, the first read voltage RD1 is applied to the first memory cell C11 and the first reset signal RSTS1 is enabled, the first memory cell C11 is an off-cell whose threshold voltage distribution is equal to or greater than the first read voltage RD1, the voltage VSOL of the first output line SOL1 is maintained as a voltage equal to or greater than the reference voltage and the first latch LATCH1 resets the read data as '0' (RST).

FIG. 8 illustrates that the first latch LATCH1 updates the read data by reading the LSB of the first memory cell C11 using the fifth read voltage RD5 after reading the LSB of first memory cell C11 using the first read voltage RD1.

When the first memory cell C11 has one of the erased state SE and the first through fourth programmed states S1~S4 and the fifth read voltage RD5 is applied to the first memory cell C11, the first memory cell C11 is an on-cell, the voltage VSOL of the first output line SOL drops below the reference voltage and the first latch LATCH1 maintains the read data as '1' (MTD).

When the first memory cell C11 has one of the fifth through seventh programmed states S5~S7, the fifth read voltage RD5 is applied to the first memory cell C11 and the first set signal STS1 is enabled, the first memory cell C11 is an off-cell, the voltage VSOL of the first output line SOL is maintained as a voltage equal to or greater than the reference voltage and the first latch LATCH1 sets the read data as '1' (SET).

FIGS. 9 through 12 are graphs illustrating an operation of the first page buffer PB1 of FIG. 3 according to an exemplary embodiment of the inventive concept.

Figure 9:
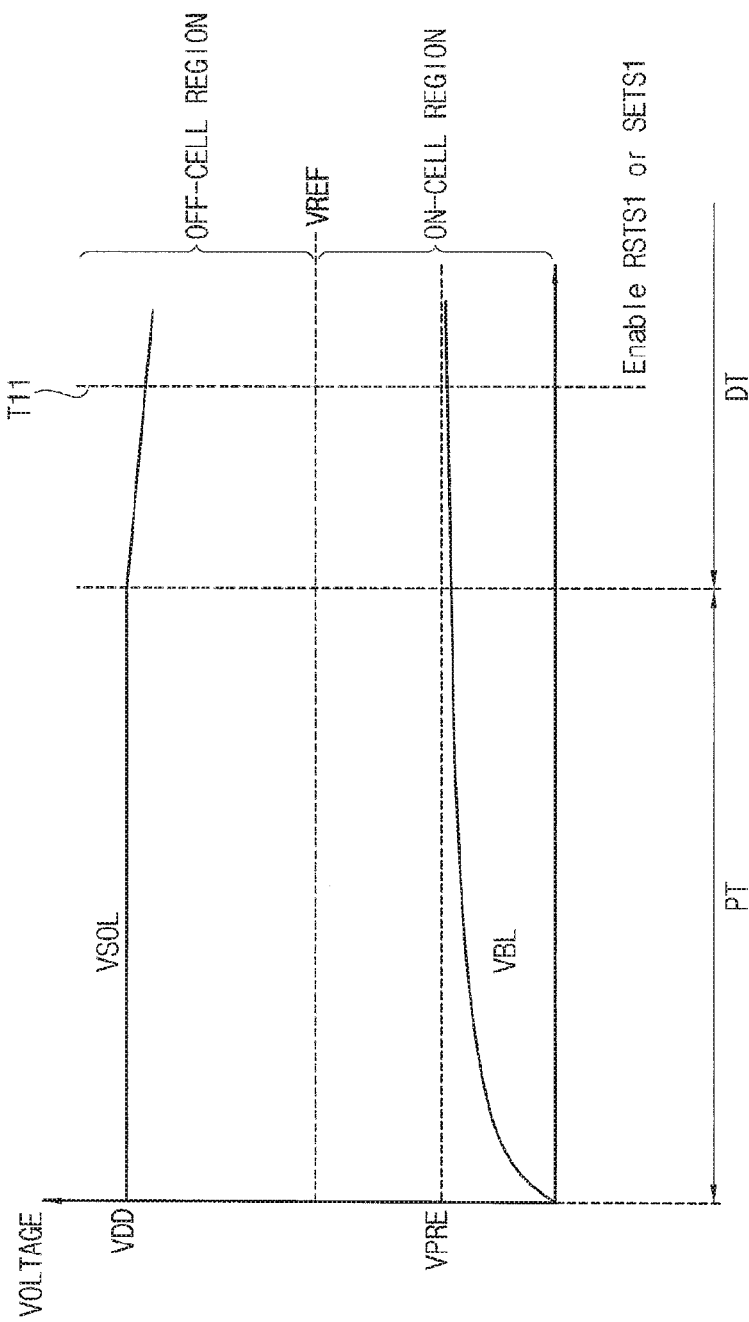
FIGS. 9 through 12 are graphs illustrating an operation of the first page buffer of FIG. 3 according to an exemplary embodiment of the inventive concept.

Referring to FIGS. 6 and 9, during a precharge interval PT, the first page buffer PB1 charges the first bitline BL1 with a precharge voltage VPRE and charges the first output line SOL1 with the power supply voltage VDD by enabling the load enable signal LES and the bitline enable signal with '0' and '1' respectively.

During a developing interval DT, the first page buffer PB1 discharges the first output line SOL1 through the first bitline BL1 by disabling the load enable signal LES with '1' and enabling the bitline enable signal with '1'.

A first sampling timing T11 may be located within the developing interval DT.

When the voltage VSOL of the first output line SOL1 is equal to or greater than the reference voltage VREF at the first sampling timing T11, because the current flowing through the first bitline BL1 is weak, the first memory cell C11 may be determined as an off-cell whose threshold voltage is equal to or greater than a read voltage.

Figure 10:
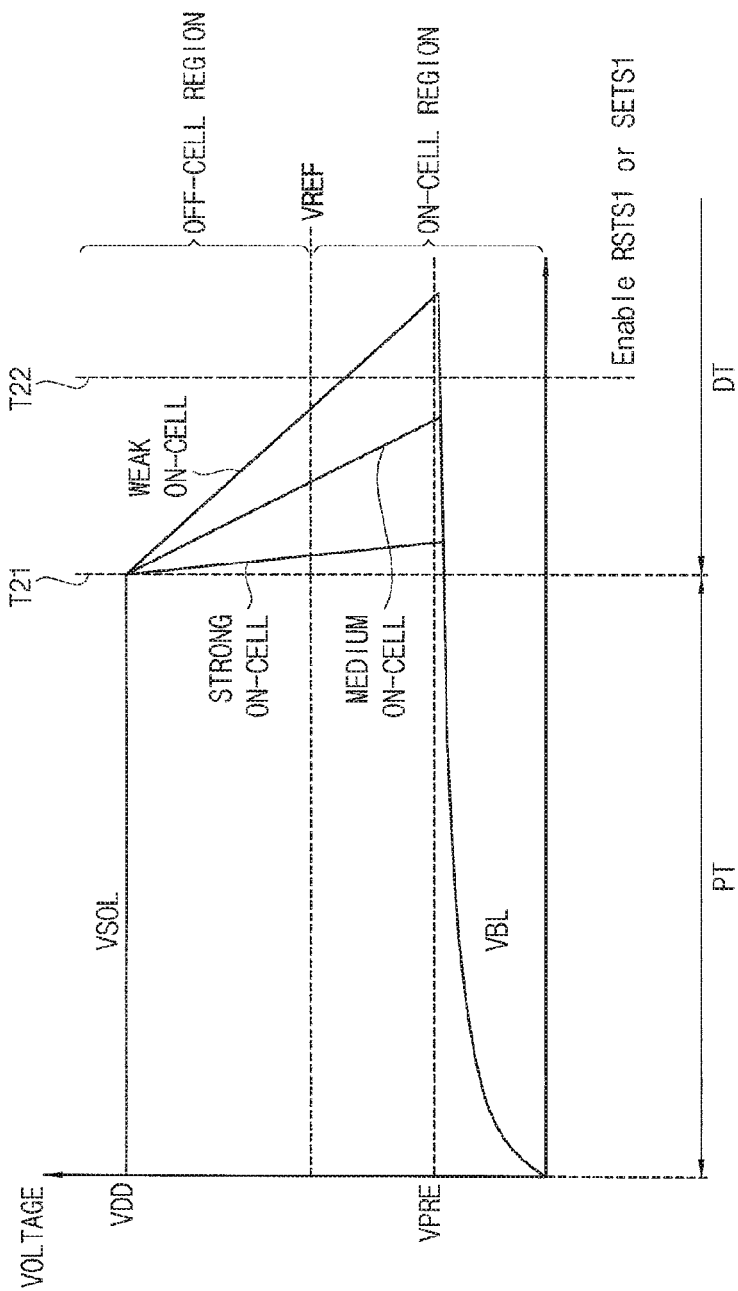
Figure 11:
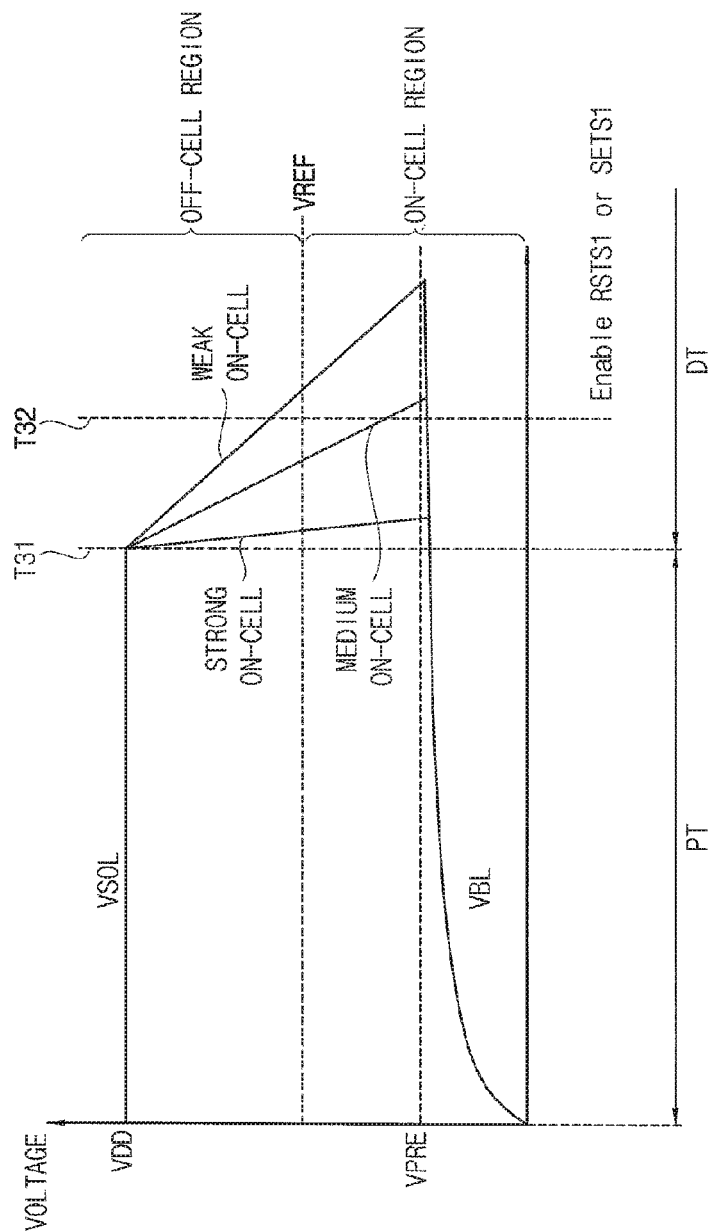
Figure 12:
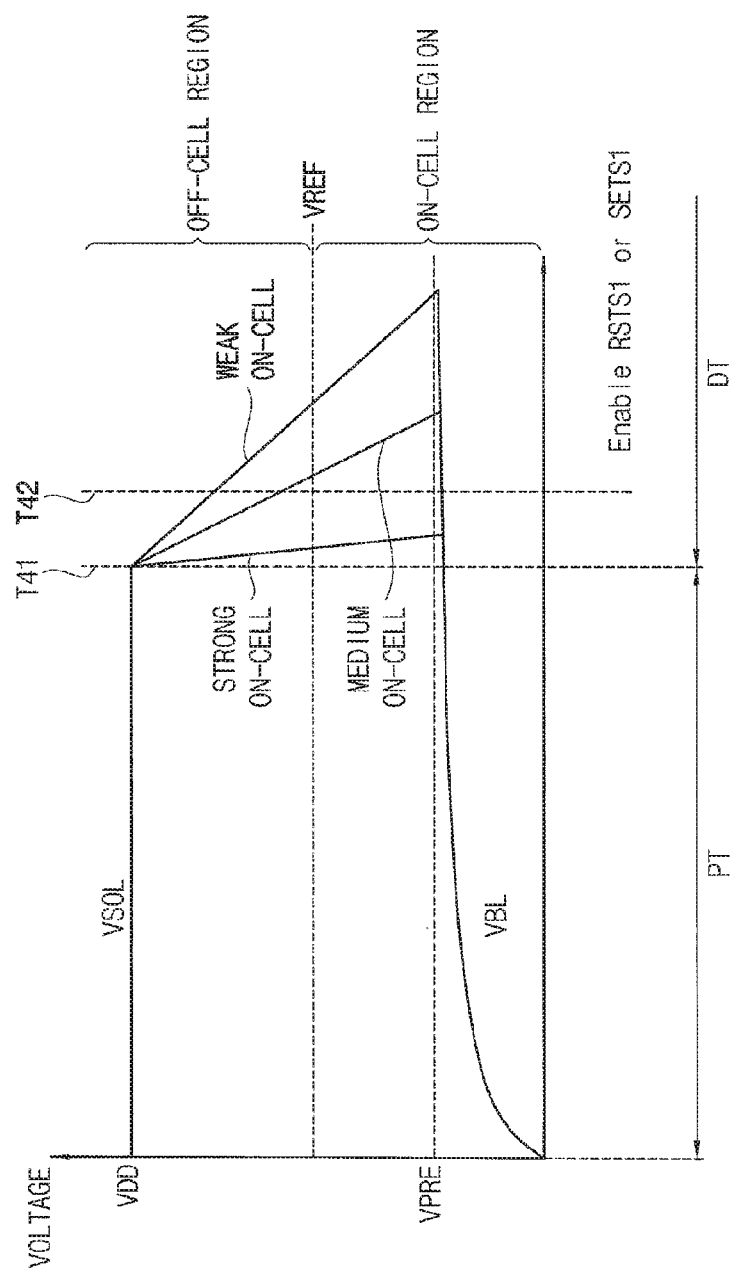

In FIGS. 10, 11, and 12, each operation in the precharge interval PT and the developing interval DT may be understood by referring back to FIG. 9.

When the voltage VSOL of the first output line SOL1 is smaller than the reference voltage VREF at a sampling timing T22, because the current flowing through the first bitline BL1 is strong, the first memory cell C11 may be determined as an on-cell whose threshold voltage is smaller than a read voltage. As the threshold voltage of the first memory cell C11 is lowered, the current flowing through the first bitline BL1 becomes stronger and the time required to discharge the voltage VSOL of the first output line SOL1 becomes shorter.

During an interval from a timing T21, e.g., the start of the developing interval DT, to the sampling timing T22, a similar result may be obtained when the data of the first memory cell C11 is read by changing the read voltage. The earlier the sampling time T22, the higher the probability that the first memory cell C11 is determined as an off-cell. The later the sampling time T22, the higher the probability that the first memory cell C11 is determined as an on-cell.

FIG. 10 illustrates a case when the interval from the start of the timing T21 to the sampling timing T22 is long and the probability that the first memory cell C11 is determined as an on-cell is high. This may be similar to the case when the first memory cell C11 is read with a higher read voltage. In this case, when the first memory cell C11 is programmed to have a relatively low threshold voltage (STRONG ON-CELL), programmed to have an intermediate threshold voltage (MEDIUM ON-CELL), or programmed to have a relatively high threshold voltage (WEAK ON-CELL), the first memory cell C11 is determined as an on-cell in all of three cases.

FIG. 11 illustrates a case when the interval from a timing T31, e.g., the start of the developing interval DT, to a sampling timing T32 is between long and short. This may be similar to the case when the first memory cell C11 is read with an intermediate-level read voltage. In this case, when the first memory cell C11 is programmed to have a relatively low threshold voltage (STRONG ON-CELL) or programmed to have an intermediate threshold voltage (MEDIUM ON-CELL), the first memory cell C11 is determined as an on-cell. In addition, when the first memory cell C11 is programmed to have a relatively high threshold voltage (WEAK ON-CELL), the first memory cell C11 is determined as an off-cell.

FIG. 12 illustrates a case when the interval from a timing T41, e.g., the start of the developing interval DT, to a sampling timing T42 is short. This may be similar to the case when the first memory cell C11 is read with a lower read voltage. In this case, when the first memory cell C11 is programmed to have a relatively low threshold voltage (STRONG ON-CELL), the first memory cell C11 is determined as an on-cell. When the first memory cell is programmed to have an intermediate threshold voltage (MEDIUM ON-CELL) or is programmed to have a relatively high threshold voltage (WEAK ON-CELL), the first memory cell C11 is determined as an off-cell.

The first latch LATCH1 in FIG. 3 samples the voltage VSOL of the first output line SOL1 at a later sampling timing as illustrated in FIG. 10, the second latch LATCH2 in FIG. 3 samples the voltage VSOL of the first output line SOL1 at an intermediate sampling timing as illustrated in FIG. 11 and the L-th latch LATCHL in FIG. 3 samples the voltage VSOL of the first output line SOL1 at an earlier sampling timing as illustrated in FIG. 12. In an exemplary embodiment of the inventive concept, the first latch LATCH1 corresponds to FIG. 12 and the L-th latch LATCHL corresponds to FIG. 10.

Figure 13:
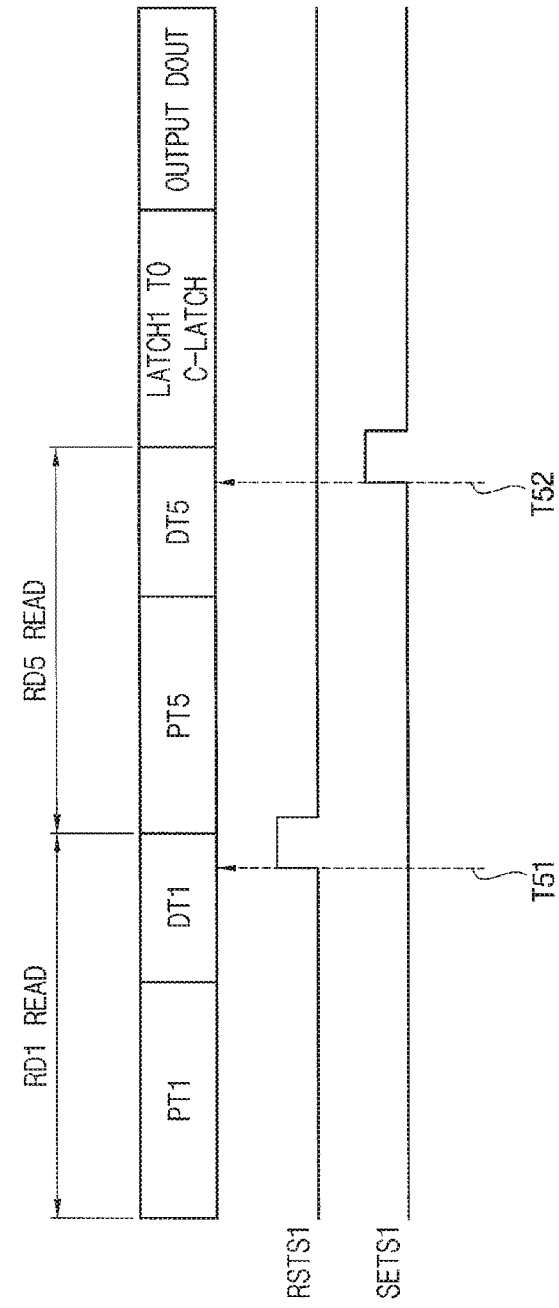
FIG. 13 is diagram for illustrating a read operation when the first page buffer of FIG. 3 includes only the first latch according to an exemplary embodiment of the inventive concept.

FIG. 13 is a diagram for illustrating a read operation when the first page buffer PB1 of FIG. 3 includes only the first latch LATCH1 according to an exemplary embodiment of the inventive concept.

Referring to FIG. 13, the first read voltage RD1 is applied during a time period RD1 READ and the fifth read voltage RD5 is applied during a time period RD5 READ. The time period RD1 READ is composed of a precharge interval PT1 and a developing interval DT1. The time period RD5 READ is composed of a precharge interval PT5 and a developing interval DT5.

Referring to FIG. 13, after the first read voltage RD1 is applied to one wordline, the first latch LATCH1 generates the read data by sampling the voltage of the first output line SOL1 at a first sampling timing T51 during the developing interval DT1 (e.g., when RSTS1 goes high). Then, the first latch LATCH1 updates the read data by sampling the voltage of the first output line SOL1 at a second sampling timing T52 during the developing interval DT5 (e.g., when SETS1 goes high). The cache output signal COS is enabled and the first page buffer PB1 outputs the read data of the first latch LATCH1 through the cache latch C-LATCH as the first output data D1. When the first output data D1 includes errors that are uncorrectable by an ECC, the time required to perform a read retry operation is long because the overall process of FIG. 13 is repeated.

Figure 14:
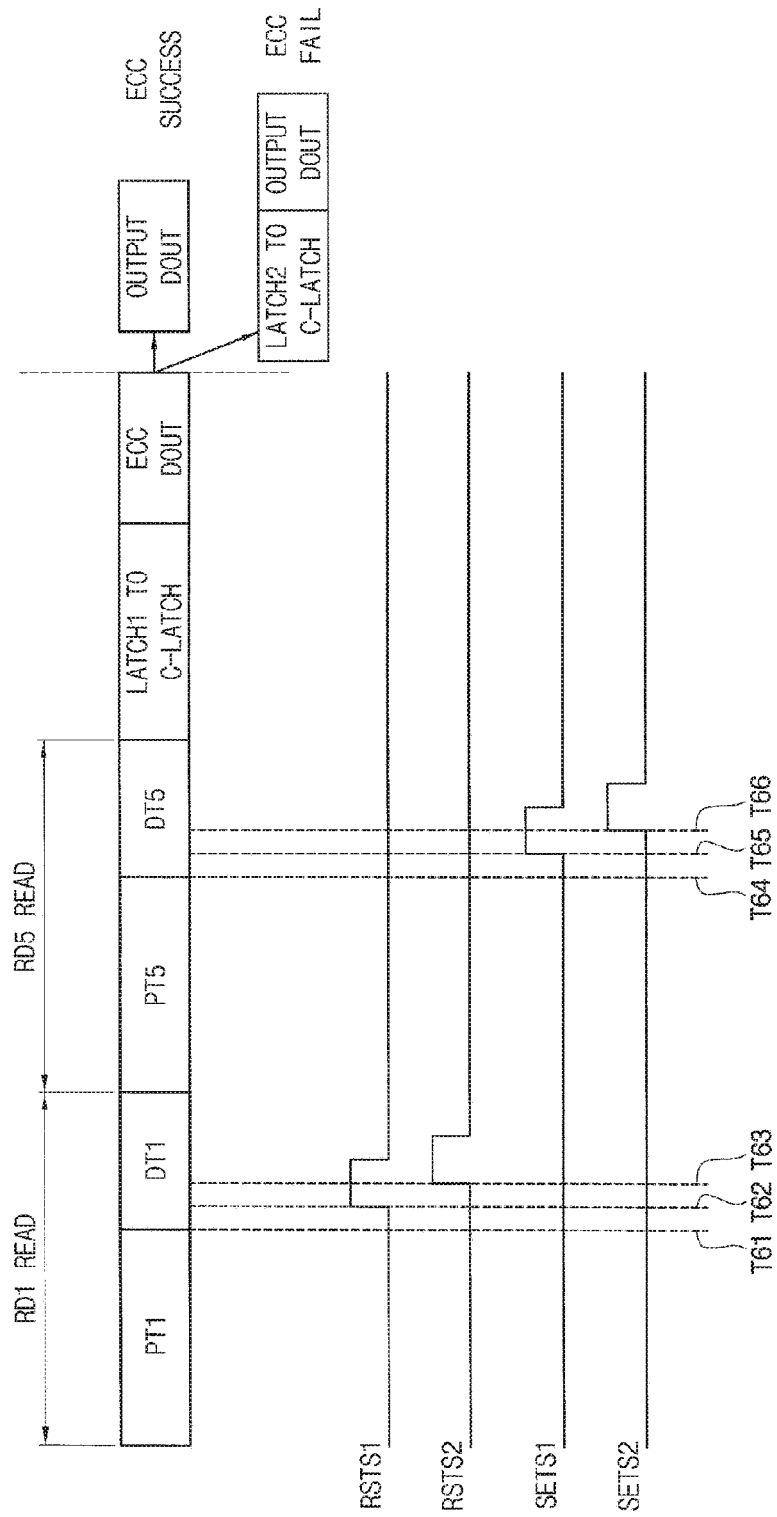
FIG. 14 is diagram for illustrating a read operation when the first page buffer of FIG. 3 includes first and second latches according to an exemplary embodiment of the inventive concept.

FIG. 14 is a diagram for illustrating a read operation when the first page buffer PB1 of FIG. 3 includes the first and second latches LATCH1 and LATCH2 according to an exemplary embodiment of the inventive concept.

In FIG. 14, it is assumed that a sampling timing of the first latch LATCH1 is earlier than a sampling timing of the second latch LATCH2. In an exemplary embodiment of the inventive concept, the sampling timing of the second latch LATCH2 may be earlier than the sampling timing of the first latch LATCH1.

Referring to FIG. 14, after the first read voltage RD1 is applied to one wordline, the developing interval DT1 starts at a timing T61, the first latch LATCH1 generates the read data by sampling the voltage of the first output line SOL1 at a first sampling timing T62 (e.g., when RSTS1 goes high), and the second latch LATCH2 generates the read data by sampling the voltage of the first output line SOL1 at a second sampling timing T63 (e.g., when RSTS2 goes high). Then, after the developing interval DT5 starts at a timing T64, the first latch LATCH1 updates the read data by sampling the voltage of the first output line SOL1 at a third sampling timing T65 (e.g., when SETS1 goes high) and the second latch LATCH2 updates the read data by sampling the voltage of the first output line SOL1 at a fourth sampling timing T66 (e.g., when SETS2 goes high). The cache output signal COS is enabled, the first page buffer PB1 moves the read data of the first latch LATCH1 to the cache latch C-LATCH, and the errors of the read data of the first latch LATCH1 are corrected using an ECC in the cache latch C-LATCH. When the errors are correctable (ECC SUCCESS), the error-corrected read data of the first latch LATCH1 is output as the first output data D1. When the errors are uncorrectable (ECC FAIL), the read data of the second latch LATCH2 is output as the first output data D1.

Figure 15:
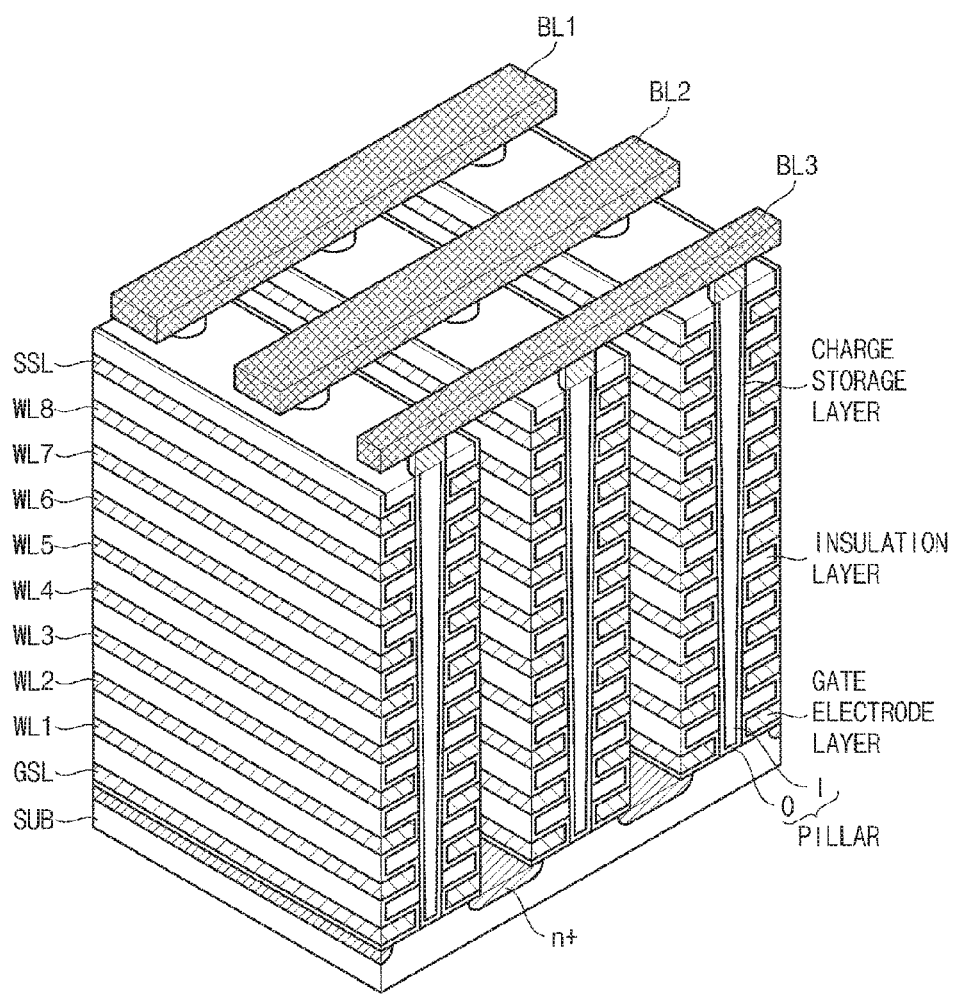
FIG. 15 is a perspective view illustrating a memory cell array in the nonvolatile memory device of FIG. 1, which is implemented with a three-dimensional (3-D) structure according to an exemplary embodiment of the inventive concept.

FIG. 15 is a perspective view illustrating a memory cell array in the nonvolatile memory device of FIG. 1, which is implemented with a three-dimensional (3-D) structure according to an exemplary embodiment of the inventive concept.

Referring to FIG. 15, a memory cell array 130A may be formed in a direction perpendicular to a substrate SUB. An n+ doped region may be formed in the substrate SUB. A gate electrode layer and an insulation layer may be alternately deposited on the substrate SUB. In addition, a charge storage layer may be formed between the gate electrode layer and the insulation layer.

When the gate electrode layer and the insulation layer are vertically patterned, a V-shaped pillar may be formed. The pillar may penetrate the gate electrode layer and the insulation layer to be connected to the substrate SUB. An outer portion O of the pillar may be configured with a channel semiconductor, and an inner portion I of the pillar may be configured with an insulation material such as silicon oxide.

The gate electrode layer may be connected to the ground selection line GSL, the plurality of wordlines WL1 to WL8, and the string selection line SSL. The pillar may be connected to the plurality of bitlines BL1 to BL3.

It is illustrated in FIG. 15 as an example, that the memory cell array 130A has the ground selection line GSL, the string selection line SSL, eight wordlines WL1 to WL8, and three bitlines BL1 to BL3, but the inventive concept is not limited thereto.

Figure 16:
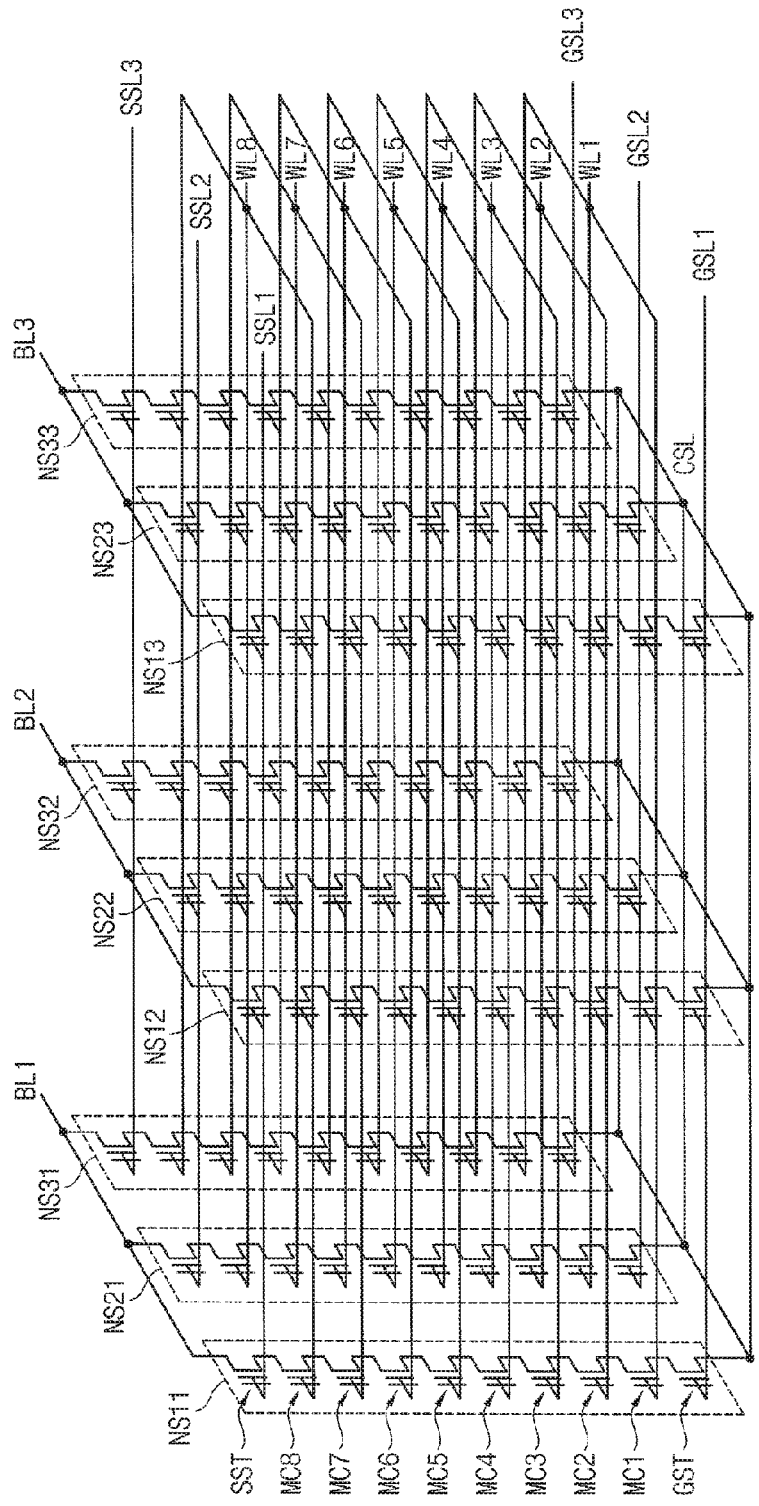
FIG. 16 is a circuit diagram illustrating an equivalent circuit of the memory cell array of FIG. 15 according to an exemplary embodiment of the inventive concept.

FIG. 16 is a circuit diagram illustrating an equivalent circuit of the memory cell array of FIG. 15 according to an exemplary embodiment of the inventive concept.

Referring to FIG. 16, NAND strings NS11 to NS33 may be connected between the bitlines BL1 to BL3 and a common source line CSL. Each NAND string (e.g., NS11) may include a string selection transistor SST, a plurality of memory cells MC1 to MC8, and a ground selection transistor GST.

The string selection transistor SST may be connected to string selection lines SSL1 to SSL3. The plurality of memory cells MC1 to MC8 may be connected to corresponding wordlines WL1 to WL8, respectively. The ground selection transistor GST may be connected to ground selection lines GSL1 to GSL3. The string selection transistor SST may be connected to the bitlines BL1 to BL3, and the ground selection transistor GST may be connected to the common source line CSL.

Wordlines (e.g., WL1) having substantially the same height may be commonly connected and the ground selection lines GSL1 to GSL3 and the string selection lines SSL1 to SSL3 may be separated. For example, when a physical page, which includes memory cells connected to the first wordline WL1 and is included in the NAND strings NS11, NS12, and NS13, is programmed, the first wordline WL1, the first string selection line SSL1, and the first ground selection line GSL1 may be selected.

Figure 17A:
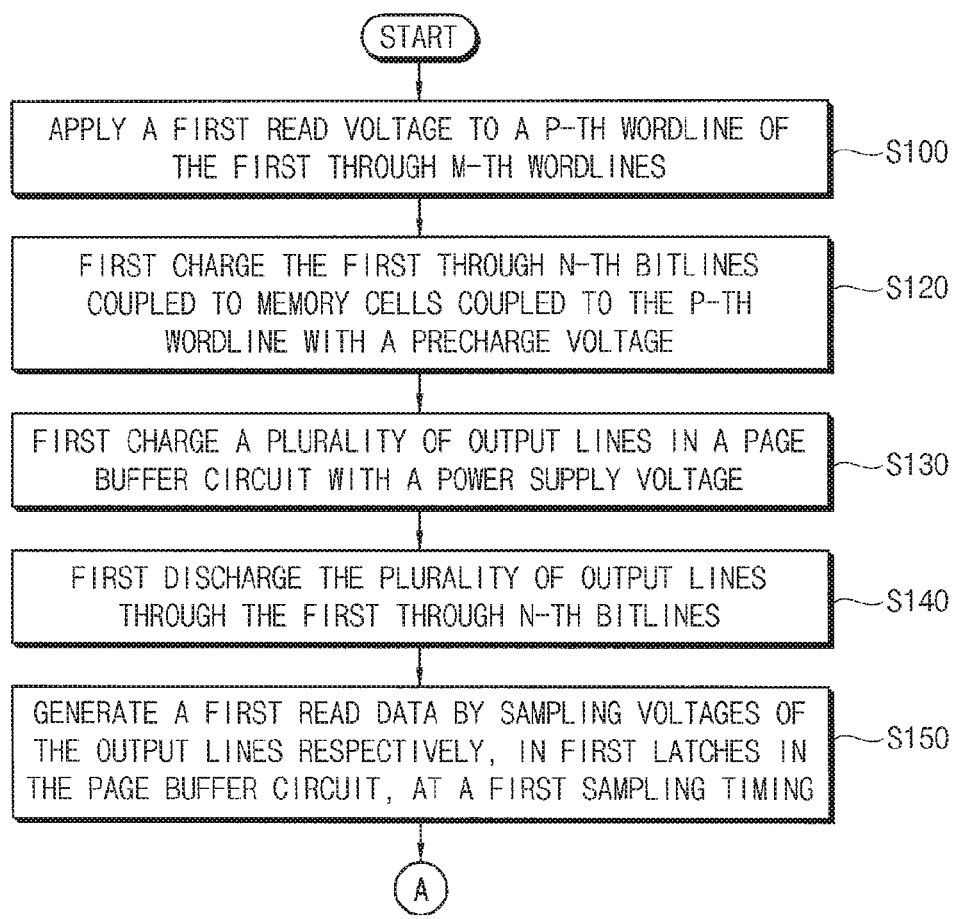
FIGS. 17A, 17B, and 18 are flow charts illustrating a method of operating a nonvolatile memory device according to an exemplary embodiment of the inventive concept.
Figure 17B:
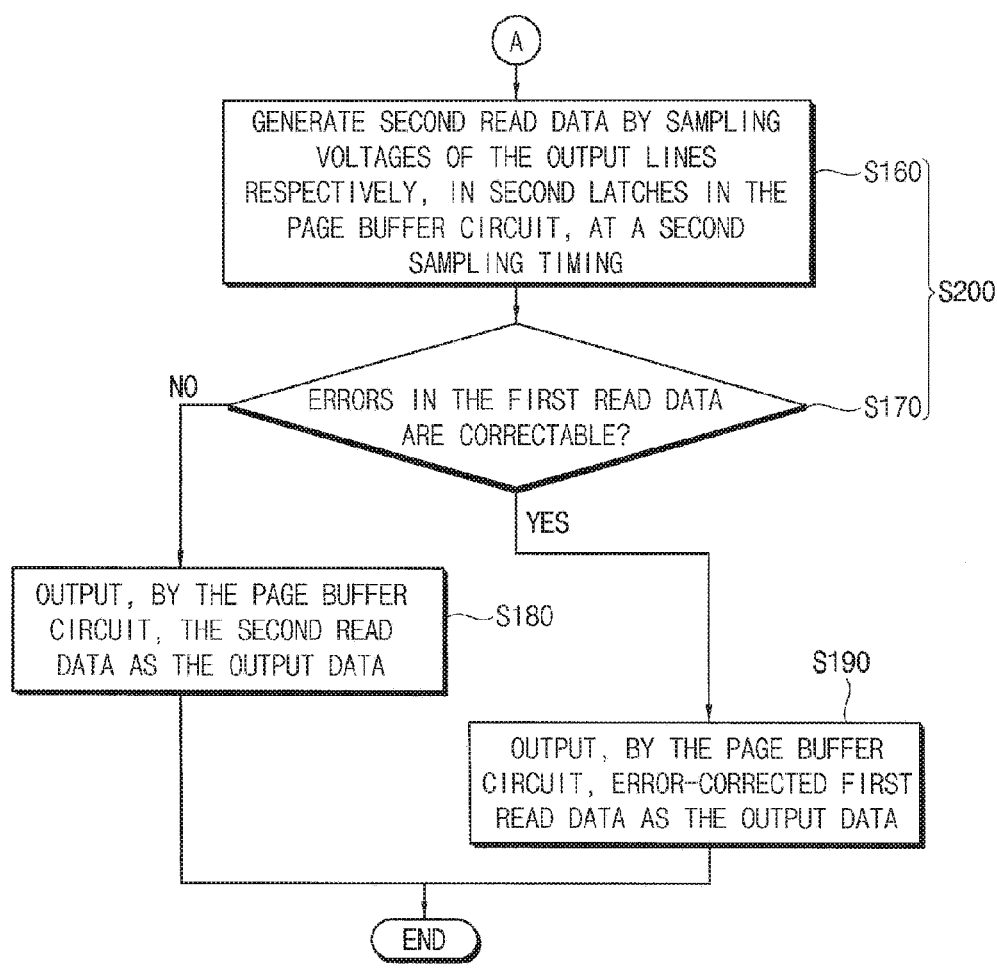
Figure 18:
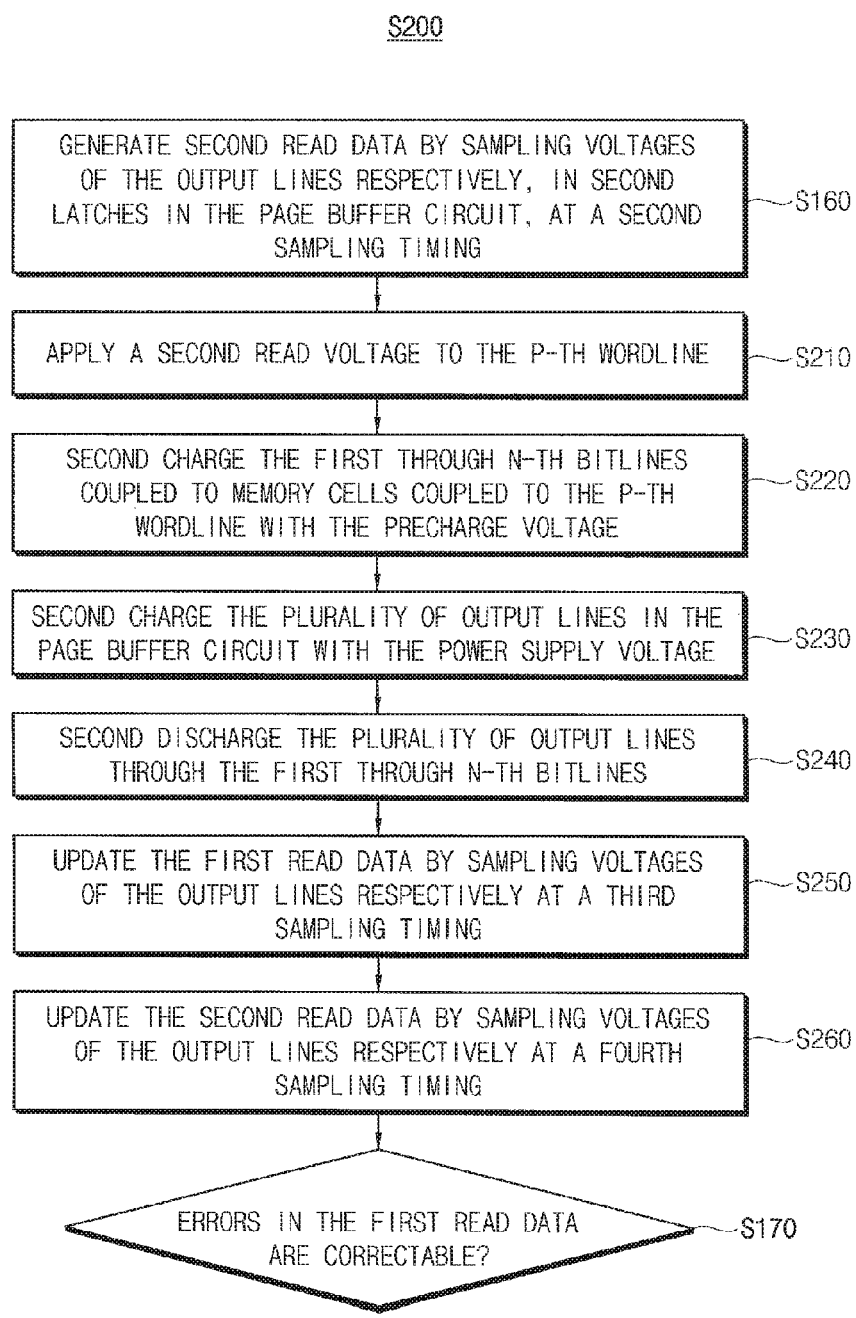

FIGS. 17A, 17B, and 18 are flow charts illustrating a method of operating a nonvolatile memory device according to an exemplary embodiment of the inventive concept.

Referring to FIGS. 1 through 17B, in a method of operating a nonvolatile memory device 100 including a memory cell array 130 which has a plurality of memory cells coupled to first through M-th wordlines WL1~WLM and first through N-th bitlines BL1~BLN, respectively, wherein M and N are integers greater than two, a first read voltage is applied to a P-th wordline WLP of the first through M-th wordlines, wherein P is a natural number less than or equal to M (S110). The first through N-th bitlines BL1~BLN coupled to memory cells coupled to the P-th wordline WLP are first charged with a precharge voltage VPRE (S120). A plurality of output lines in a page buffer circuit 140 are first charged with a power supply voltage VDD, and the buffer circuit 140 is coupled to the first through N-th bitlines BL1~BLN (S130). The plurality of output lines are first discharged through the first through N-th bitlines BL1~BLN (S140). A first read data is generated by sampling voltages of the output lines, respectively, in the first latches of the page buffer circuit 140 at a first sampling timing (S150). Moving now to FIG. 17B, a second read data is generated by sampling voltages of the output lines, respectively, in the second latches of the page buffer circuit 130 at a second sampling timing (S160). It is determined whether errors in the first read data are correctable (S170). This step may include determining whether the errors in the first read data are correctable using an ECC. The steps S160 and S170 may constitute a step S200.

The page buffer circuit 140 outputs output data based on whether the errors in the first read data are correctable (S180 and S190). For example, when the errors in the first read data are uncorrectable (NO in S170), the page buffer circuit 140 outputs the second read data as the output data (S180). When the errors in the first read data are correctable (YES in S170), the page buffer circuit 140 outputs the error-corrected first read data as the output data (S190).

The steps S110~S190 may be further understood by referring to the descriptions with reference to FIGS. 1 through 16.

Referring to FIG. 18, for operating the nonvolatile memory device 100 after S160, a second read voltage is further applied to the P-th wordline WLP (S210), the first through N-th bitlines BL1~BLN coupled to memory cells coupled to the P-th wordline WLP are second charged with the precharge voltage VPRE (S220), the output lines in the page buffer circuit 140 are second charged with the power supply voltage VDD (S230), the output lines are second discharged through the first through N-th bitlines BL1~BLN (S240), the first read data is updated by sampling voltages of the output lines, respectively, in the first latches of the page buffer circuit 140 at a third sampling timing (S250), and the second read data is updated by sampling voltages of the output lines, respectively, in the second latches of the page buffer circuit 140 at a fourth sampling timing (S260).

Referring to FIGS. 14 and 18, an interval from the timing T61 when the first developing/discharging starts to the first sampling timing T62 may be substantially the same as an interval from the timing T64 when the second developing/discharging starts to the third sampling timing T65. In addition, an interval from the timing T61 when the first developing/discharging starts to the second sampling timing T63 may be substantially the same as an interval from the timing T64 when the second developing/discharging starts to the fourth sampling timing T66.

The steps S210~S260 may be further understood by referring to the descriptions with reference to FIGS. 1 through 16.

Figure 19:
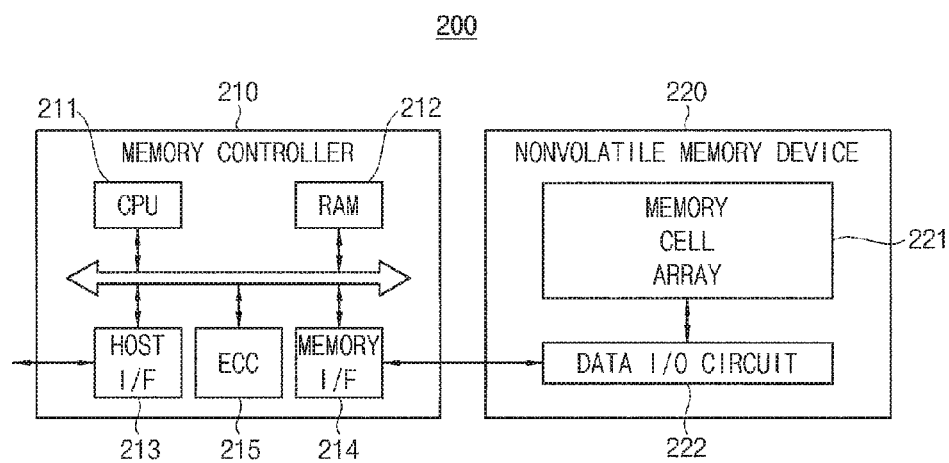
FIG. 19 is a block diagram illustrating a memory system according to an exemplary embodiment of the inventive concept.

FIG. 19 is a block diagram illustrating a memory system according to an exemplary embodiment of the inventive concept.

Referring to FIG. 19, a memory system 200 includes a memory controller 210 and a nonvolatile memory device 220. The nonvolatile memory device 220 includes a memory cell array 221 and a data I/O circuit 222. The memory cell array 221 is formed on a substrate in a 3-D structure. The memory cell array 221 having the 3-D structure may be described with reference to FIGS. 15 and 16.

The data I/O circuit 222 is connected to the memory cell array 221 through the plurality of bitlines. The data I/O circuit 222 may select at least one of the plurality of bitlines, output data read from a memory cell connected to the selected bitline(s) to the memory controller 210, and write data received from the memory controller 210 to a memory cell connected to the selected bitline(s).

The nonvolatile memory device 220 may be implemented with the nonvolatile memory device 100 of FIG. 1. The nonvolatile memory device 220 may correspond to that described with reference to FIGS. 1 through 16.

The memory controller 210 may control the nonvolatile memory device 220. The memory controller 210 may control data transfer between an external host and the nonvolatile memory device 220.

The memory controller 210 may include a central processing unit 211, a buffer memory 212, a host interface 213 and a memory interface 214.

The central processing unit 211 may perform operations for the data transfer. The buffer memory 212 may be implemented by a dynamic random access memory (DRAM), a static random access memory (SRAM), a phase change random access memory (PRAM), a ferroelectric random access memory (FRAM), a resistance random access memory (RRAM), a magnetic random access memory (MRAM), etc.

The buffer memory 212 may be an operational memory of the central processing unit 211. In an exemplary embodiment of the inventive concept, the buffer memory 212 may be included in the memory controller 210. In an exemplary embodiment of the inventive concept, the buffer memory 212 may be outside of the memory controller 210.

The host interface 213 may be coupled to the host, and the memory interface 214 may be coupled to the nonvolatile memory device 220. The central processing unit 211 may communicate with the host via the host interface 213. For example, the host interface 213 may be configured to communicate with the host using at least one of various interface protocols, such as a universal serial bus (USB), a multimedia card (MMC), a peripheral component interconnect-express (PCI-E), a small computer system interface (SCSI), a serial-attached SCSI (SAS), a serial advanced technology attachment (SATA), a parallel advanced technology attachment (PATA), an enhanced small disk interface (ESDI), integrated drive electronics (IDE), and so on.

Further, the central processing unit 211 may communicate with the nonvolatile memory device 220 via the memory interface 214.

In an exemplary embodiment of the inventive concept, the memory controller 210 may further include an error correction block 215 for error correction. The components of the memory controller 210 may communicate via a bus.

In an exemplary embodiment of the inventive concept, the memory controller 210 may be included in the nonvolatile memory device 220, or the memory controller 210 and the nonvolatile memory device 220 may be implemented as separate chips.

The memory system 200 may be implemented as a memory card, a solid state drive, and so on.

Figure 20:
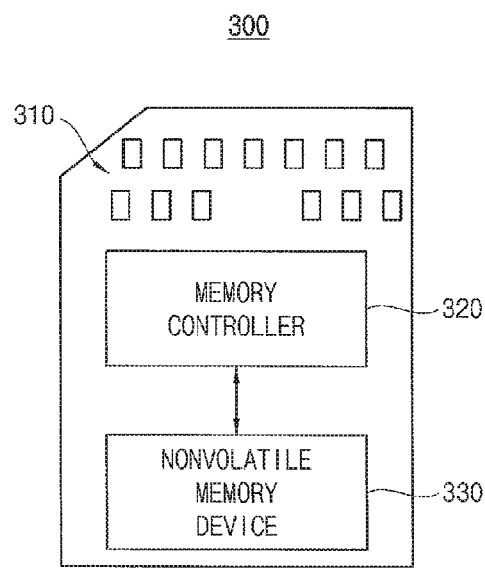
FIG. 20 is a block diagram illustrating a memory card according to an exemplary embodiment of the inventive concept.

FIG. 20 is a block diagram illustrating a memory card according to an exemplary embodiment of the inventive concept.

Referring to FIG. 20, a memory card 300 includes a plurality of connecting pins 310, a memory controller 320 and a nonvolatile memory device 330.

The connecting pins 310 may be coupled to an external host to transfer signals between the host and the memory card 300. The connecting pins 310 may include a clock pin, a command pin, a data pin and/or a reset pin.

The memory controller 320 may receive data from the host, and may store the received data in the nonvolatile memory device 330.

The nonvolatile memory device 330 may include a memory cell array formed on a substrate in a 3-D structure. Memory cells included in the memory cell array may be formed in a direction perpendicular to the substrate. The memory cells included in the memory cell array may be connected to a plurality of wordlines, which are stacked in a direction perpendicular to the substrate, and a plurality of bitlines, which are formed in a direction parallel to the substrate.

The nonvolatile memory device 330 may be implemented with the nonvolatile memory device 100 of FIG. 1. The nonvolatile memory device 330 may be correspond to that described with reference to FIGS. 1 through 16.

The memory card 300 may include an MMC, an embedded MMC (eMMC), a hybrid embedded MMC (hybrid eMMC), a secure digital (SD) card, a micro-SD card, a memory stick, an ID card, a personal computer memory card international association (PCMCIA) card, a chip card, a USB card, a smart card, a compact flash (CF) card, and so on.

In an exemplary embodiment of the inventive concept, the memory card 300 may be coupled to the host, such as a desktop computer, a laptop computer, a tablet computer, a mobile phone, a smart phone, a music player, a personal digital assistant (PDA), a portable multimedia player (PMP), a digital television, a digital camera, a portable game console, and so on.

Figure 21:
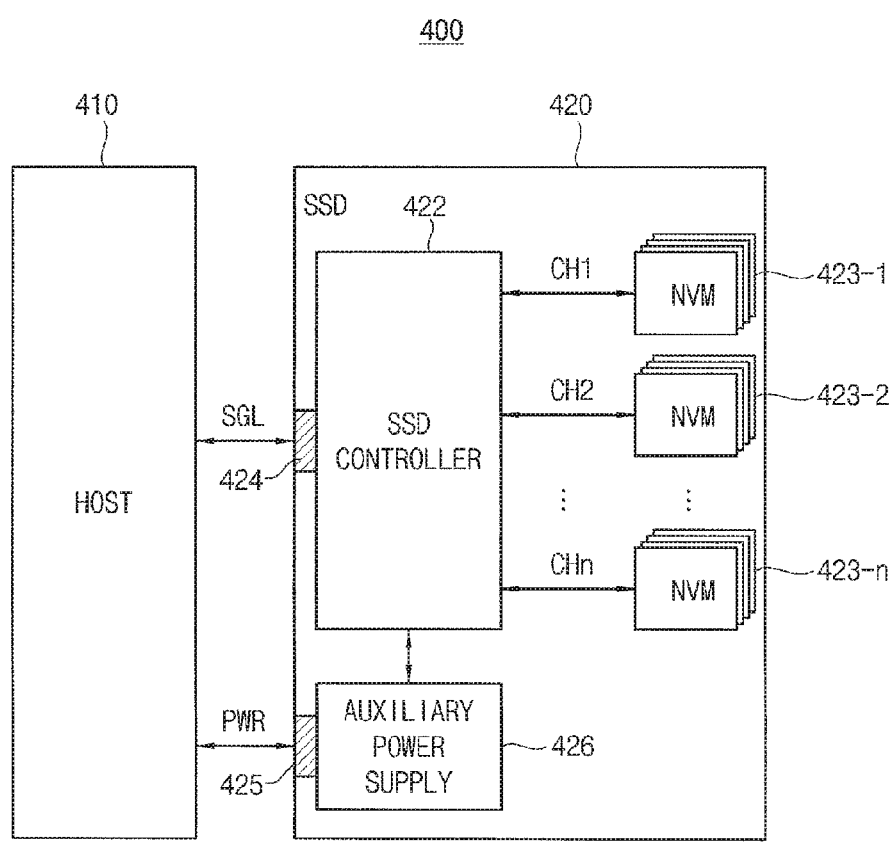
FIG. 21 is a block diagram illustrating a solid-state drive system according to an exemplary embodiment of the inventive concept.

FIG. 21 is a block diagram illustrating a solid-state drive (SSD) system according to an exemplary embodiment of the inventive concept.

Referring to FIG. 21, an SSD system 400 includes a host 410 and an SSD 420. The SSD 420 includes first through n-th nonvolatile memory devices 423-1, 423-2, . . . 423-n and a SSD controller 422. The first through n-th nonvolatile memory devices 423-1, 423-2, . . . 423-n may be used as a storage medium of the SSD 420.

Each of the first through n-th nonvolatile memory devices 423-1, 423-2, . . . 423-n may include a memory cell array formed on a substrate in a 3-D structure. Memory cells included in the memory cell array may be formed in a direction perpendicular to the substrate. The memory cells included in the memory cell array may be connected to a plurality of wordlines, which are stacked in a direction perpendicular to the substrate, and a plurality of bitlines, which are formed in a direction parallel to the substrate.

Each of the first through n-th nonvolatile memory devices 423-1, 423-2, . . . 423-n may be implemented with the nonvolatile memory device 100 of FIG. 1. The first through n-th nonvolatile memory devices 1123-1, 1123-2, . . . 1123-n may correspond to that described with reference to FIGS. 1 through 16.

The SSD controller 422 is coupled to the first through n-th nonvolatile memory devices 423-1, 423-2, . . . 423-n by first through n-th channels CH1, CH2, . . . CHn, respectively. The SSD controller 422 may exchange a signal SGL with the host 410 through a signal connector 424. The signal SGL may include a command, an address, and data. The SSD controller 422 may perform a program operation and a read operation on the first through n-th nonvolatile memory devices 423-1, 423-2, . . . 423-n according to the command received from the host 410.

The SSD 420 may further include an auxiliary power supply 426. The auxiliary power supply 426 may receive power PWR from the host 410 through a power connector 425 and provide power to the SSD controller 422. The auxiliary power supply 426 may be placed inside or outside the SSD 420. For example, the auxiliary power supply 426 may be placed in a main board and provide auxiliary power to the SSD 420.

Figure 22:
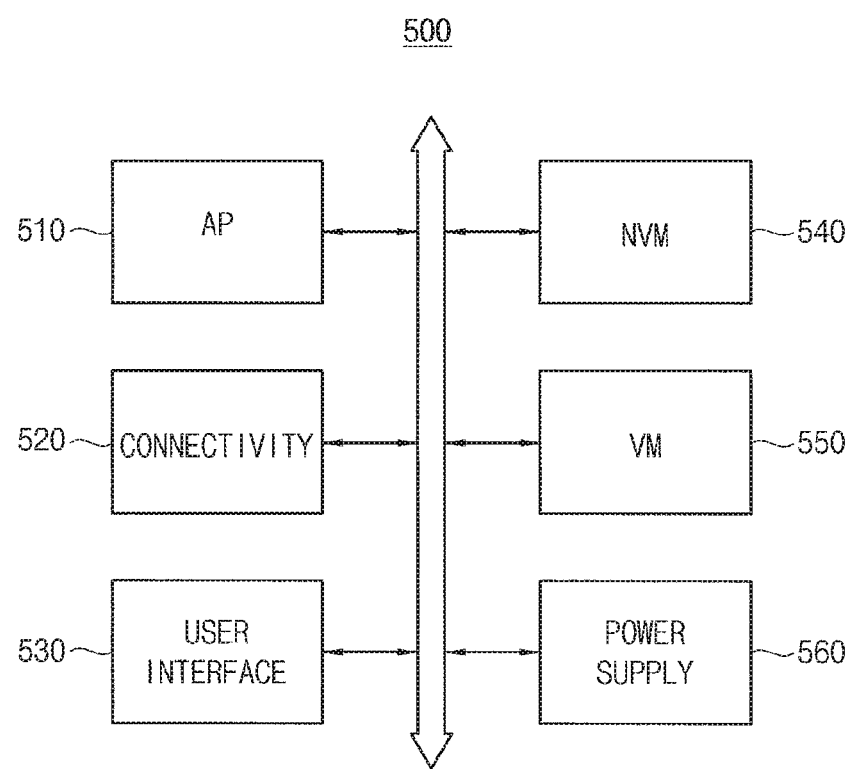
FIG. 22 is a block diagram illustrating a mobile system according to an exemplary embodiment of the inventive concept.

FIG. 22 is a block diagram illustrating a mobile system according to an exemplary embodiment of the inventive concept.

Referring to FIG. 22, a mobile system 500 includes an application processor 510, a connectivity unit 520, a user interface 530, a nonvolatile memory device 540, a volatile memory device 550 and a power supply 560. The devices may communicate via a bus.

In an exemplary embodiment of the inventive concept, the mobile system 500 may be a mobile phone, a smart phone, a PDA, a PMP, a digital camera, a music player, a portable game console, a navigation system, etc.

The application processor 510 may execute applications, such as a web browser, a game application, a video player, etc. In an exemplary embodiment of the inventive concept, the application processor 510 may include a single core or multiple cores. For example, the application processor 510 may be a multi-core processor, such as a dual-core processor, a quad-core processor, a hexa-core processor, etc. The application processor 510 may include an internal or external cache memory.

The connectivity unit 520 may perform wired or wireless communication with an external device. For example, the connectivity unit 520 may perform Ethernet communication, near field communication (NFC), radio frequency identification (RFID) communication, mobile telecommunication, memory card communication, USB communication, etc. In an exemplary embodiment of the inventive concept, the connectivity unit 520 may include a baseband chipset that supports communications, such as global system for mobile communications (GSM), general packet radio service (GPRS), wideband code division multiple access (WCDMA), high speed downlink/uplink packet access (HSxPA), etc.

The nonvolatile memory device 540 may store a boot image for booting the mobile system 500.

The nonvolatile memory device 540 may include a memory cell array formed on a substrate in a 3-D structure. Memory cells included in the memory cell array may be formed in a direction perpendicular to the substrate. The memory cells included in the memory cell array may be connected to a plurality of wordlines, which are stacked in a direction perpendicular to the substrate, and a plurality of bitlines, which are formed in a direction parallel to the substrate.

The nonvolatile memory device 540 may be implemented with the nonvolatile memory device 100 of FIG. 1. The nonvolatile memory device 540 may correspond to that described with reference to FIGS. 1 through 16.

The volatile memory device 550 may store data processed by the application processor 510, or may operate as a working memory. The user interface 530 may include at least one input device, such as a keypad, a touch screen, etc., and at least one output device, such as a speaker, a display device, etc. The power supply 560 may supply a power supply voltage to the mobile system 500.

In an exemplary embodiment of the inventive concept, the mobile system 500 may further include an image processor and/or a storage device, such as a memory card, an SSD, a hard disk drive (HDD), a CD-ROM, etc.

In an exemplary embodiment of the inventive concept, the mobile system 500 and/or components of the mobile system 500 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), or wafer-level processed stack package (WSP).

As described above with respect to the exemplary embodiments of the inventive concept, in a nonvolatile memory device and a method of operating the nonvolatile memory device, a plurality of latches may generate read data by sampling a voltage of an output line. When a read operation is performed by changing a read voltage level, the plurality of latches may obtain the same result. Thus, when errors in the read data of a first latch are uncorrectable, a read data of a second latch is output as output data without having to move data from a memory cell to the second latch and the time required for a read retry operation may be reduced.

While the inventive concept has been shown and described in reference to exemplary embodiments thereof, it will be apparent to those of ordinary skill in the art that various changes in form and detail may be made thereto without departing from the scope of the inventive concept as defined by the following claims.

What is claimed is:

1. A nonvolatile memory device comprising: a memory cell array including a plurality of memory cells coupled to first through M-th wordlines and first through N-th bitlines, wherein M and N are integers greater than two; and a page buffer circuit including first through N-th page buffers coupled to the first through N-th bitlines, respectively, wherein the first through N-th page buffers generate first through N-th output data, respectively, wherein a K-th page buffer of the first through N-th page buffers includes first through L-th latches which generate read data by sampling a voltage of a K-th output line, which is discharged through a K-th bitline, at different sampling timings after a read voltage is applied to a P-th wordline of the first through M-th wordlines, wherein K is a natural number less than or equal to N, L is a natural number greater than one, and P is a natural number less than or equal to M, and wherein the K-th page buffer outputs a K-th output data based on whether an error in the read data of the first latch is correctable.

2. The nonvolatile memory device of claim 1, wherein the K-th page buffer outputs one of the read data of the second through L-th latches as the K-th output data when the error in the read data of the first latch is uncorrectable.

3. The nonvolatile memory device of claim 1, wherein the K-th page buffer outputs error-corrected read data of the first latch as the K-th output data when the error in the read data of the first latch is correctable.

4. The nonvolatile memory device of claim 1, wherein the K-th page buffer charges the K-th bitline with a precharge voltage and charges the K-th output line with a power supply voltage, and then, discharges the K-th output line through the K-th bitline in a discharge interval, and wherein the sampling timings are located within the discharge interval.

5. The nonvolatile memory device of claim 4, wherein when the voltage of the K-th output line is greater than or equal to a reference voltage at one of the sampling timings, the K-th page buffer determines that a first memory cell connected to the P-th wordline and the K-th bitline is an off-cell whose threshold voltage is greater than or equal to the read voltage; otherwise, the K-th page buffer determines that the first memory cell is an on-cell whose threshold voltage is less than the read voltage.

6. The nonvolatile memory device of claim 4, wherein
the K-th page buffer determines, at one of the sampling timings, whether a first memory cell is either an off-cell whose threshold voltage is greater than or equal to the read voltage or an on-cell whose threshold voltage is less than the read voltage,
the earlier the sampling timing occurs during the discharge interval, the higher a probability that the K-th page buffer determines that the first memory cell is the off-cell, and
the later the sampling timing occurs during the discharge interval, the higher a probability that the K-th page buffer determines that the first memory cell is the on-cell.

7. The nonvolatile memory device of claim 4, further comprising:
a control circuit configured to generate a row address signal and a column address signal in response to a command signal and an address signal; and
an address decoder configured to apply at least one read voltage to one of the first through M-th wordlines,
wherein the page buffer circuit operates in response to the column address signal.

8. The nonvolatile memory device of claim 7, wherein when each of the memory cells is a single-level cell, the address decoder applies a read voltage to one of the first through M-th wordlines and the page buffer circuit samples the voltage of the first through N-th output lines.

9. The nonvolatile memory device of claim 7, wherein when each of the memory cells is a multi-level cell or a triple-level cell, the address decoder sequentially applies a plurality of read voltages to one of the first through M-th wordlines and the page buffer circuit sequentially samples the voltages of the first through N-th output lines multiple times.

10. A method of operating a nonvolatile memory device including a memory cell array which has a plurality of memory cells coupled to first through M-th wordlines and first through N-th bitlines, wherein M and N are integers greater than two, the method comprising:
applying a first read voltage to a P-th wordline of the first through M-th wordlines, wherein P is a natural number less than or equal to M;
charging the first through N-th bitlines with a precharge voltage;
charging a plurality of output lines in a page buffer circuit with a power supply voltage, wherein the page buffer circuit is coupled to the first through N-th bitlines;
discharging the plurality of output lines through the first through N-th bitlines at a first discharging timing;
generating a first read data by sampling voltages of the output lines in first latches of the page buffer circuit at a first sampling timing;
generating a second read data by sampling voltages of the output lines in second latches of the page buffer circuit at a second sampling timing, wherein the second sampling timing is different from the first sampling timing;
determining whether errors in the first read data are correctable; and
outputting, from the page buffer circuit, an output data based on whether the errors in the first read data are correctable.

11. The method of claim 10, further comprising: outputting, from the page buffer circuit, the second read data as the output data when the first read data includes uncorrectable errors.

12. The method of claim 10, further comprising: outputting, from the page buffer circuit, error-corrected first read data as the output data when the first read data includes correctable errors.

13. The method of claim 10, further comprising:
applying a second read voltage to the P-th wordline;
charging the first through N-th bitlines with the precharge voltage, after applying the second read voltage;
charging the plurality of output lines in the page buffer circuit with the power supply voltage, after applying the second read voltage;
discharging the plurality of output lines through the first through N-th bitlines at a second discharging timing, after applying the second read voltage;
updating the first read data by sampling voltages of the output lines in the first latches of the page buffer circuit at a third sampling timing; and
updating the second read data by sampling voltages of the output lines in the second latches of the page buffer circuit at a fourth sampling timing.

14. The method of claim 13, wherein an interval from the first discharging timing to the first sampling timing is substantially the same as an interval from the second discharging timing to the third sampling timing, and
wherein an interval from the first discharging timing to the second sampling timing is substantially the same as an interval from the second discharging timing to the fourth sampling timing.

15. The method of claim 10, wherein determining whether the errors in the first read data are correctable comprises determining whether the errors in the first read data are correctable using an error correction code (ECC).

16. A method of operating a nonvolatile memory device including a page buffer circuit with first through N-th page buffers, wherein a K-th page buffer includes first through L-th latches, N and L are integers greater than two, and K is a natural number less than or equal to N, the method comprising:
generating read data by sampling voltages of output lines in the first through L-th latches;
determining whether errors in a first read data from the first latch are correctable;
outputting, from the page buffer circuit, the first read data as an output data if the errors in the first read data are all correctable, after the errors in the first read data have been corrected; and
outputting, from the page buffer circuit, read data from one of the second through L-th latch as the output data if there is at least one error in the first read data that is uncorrectable.

17. The method of claim 16, wherein the output data is output through a cache latch.

18. The method of claim 16, wherein the read data is generated at a plurality of sampling timings, the sampling timings corresponding to first through L-th set signals and reset signals that are applied to the first through L-th latches, respectively.

19. The method of claim 16, further comprising:
discharging an output line of the K-th page buffer during a developing interval, wherein generating the read data occurs during the developing interval.

20. The method of claim 19, further comprising:
generating read data of the first latch at a first sampling timing; and
generating read data of the second latch at a second sampling timing,
wherein the first sampling timing and the second sampling timing are within the developing interval, and
the first sampling timing and the second sampling timing are different.

* * * * *